(12) United States Patent
Van Myers et al.

(10) Patent No.: US 6,272,670 B1
(45) Date of Patent: Aug. 7, 2001

(54) DISTRIBUTED CHARGE SOURCE

(75) Inventors: Jeffrey Van Myers, Driftwood; Michael L. Longwell, Austin; William Daune Atwell, Spicewood, all of TX (US)

(73) Assignee: Madrone Solutions, Inc., Austin, TX (US)

( * ) Notice: Subject to any disclaimer, the term of this patent is extended or adjusted under 35 U.S.C. 154(b) by 0 days.

(21) Appl. No.: 09/286,188

(22) Filed: Apr. 5, 1999

(51) Int. Cl.$^7$ ........................................................ G06F 17/50
(52) U.S. Cl. ............................ 716/17; 365/226; 327/536
(58) Field of Search ............................ 716/17; 365/226; 327/536, 537

(56) References Cited

U.S. PATENT DOCUMENTS 5,301,097   4/1994   McDaniel ............................... 363/60
5,877,651   3/1999   Furutani ................................ 327/538
6,023,188 * 2/2000   Lee et al. .............................. 327/536

* cited by examiner

Primary Examiner—David Nelms
Assistant Examiner—Thong Le
(74) Attorney, Agent, or Firm—Sandra L. Godsey; Kent J. Cooper; Jeffrey Van Myers

(57) ABSTRACT

In one embodiment, a plurality of atomic charge pumps (52, 54, 56) are connected together in series to form a distributed charge source (24). The atomic charge pumps (52, 54, 56) are operated sequentially over time to reduce supply signal noise. In addition, the distibuted charge source (24) is compatible with low power applications because each atomic charge pump (52, 54, 56) can be independently powered down if it is not required.

22 Claims, 20 Drawing Sheets

DISTRIBUTED CHARGE SOURCE

FIELD OF THE INVENTION

The present invention relates to integrated circuits, and more specifically to integrated circuit memories.

REFERENCE TO CO-PENDING APPLICATIONS

The present invention is related to the following co-pending applications for patents:

"TILED MEMORY AND MEMORY TILE FOR USE THEREIN" by William Daune Atwell, et al., having Ser. No. 09/286,178 and assigned to the assignee hereof and filed concurrently herewith;

"MEMORY TILE FOR USE IN A TILED MEMORY" by Michael L. Longwell, et al., having Ser. No. 09/286,186 and assigned to the assignee hereof and filed concurrently herewith;

"METHOD FOR DESIGNING A TILED MEMORY" by William Daune Atwell, et al., having Ser. No. 09/286,186 and assigned to the assignee hereof and filed concurrently herewith;

"METHOD FOR DESIGNING A MEMORY TILE FOR USE IN A TILED MEMORY" by Michael L. Longwell, et al., having Ser. No. 09/286,206 and assigned to the assignee hereof and filed concurrently herewith.

BACKGROUND OF THE INVENTION

Modern integrated circuits require on chip charge sources to provide voltage signals to various portions of the integrated circuit. For example, charge sources are used to provide voltage signals to capacitor plates in dynamic random access memories. In addition, they are also used to provide voltage signals which are used to bias well regions, so that noise, leakage current and soft error rate can be reduced. Unfortunately, these charge sources also create noise within integrated circuits. Specifically, when the charge sources are initially turned on they produce a voltage signal which contains noise, and this can adversely effect the operation and performance of integrated circuits which have low operating voltages.

Accordingly, a need exists for a charge source that produces a reference voltage that has reduced noise.

SUMMARY OF THE INVENTION

The present invention overcomes the problems of the prior art memory circuits by providing a distributed charge source supply. According to the present invention, a plurality of atomic charge sources are integrated into an integrated circuit device. In accordance with the present invention, each of the atomic charge sources provides one unit of charge per unit time. In an integrated circuit requiring n units of charge per unit time, at least n atomic charge sources are provided. In one embodiment, each of the atomic charge sources is an atomic charge pump. In this embodiment, the atomic charge pumps are operated sequentially. In one alternate embodiment, the atomic charge sources are atomic voltage regulators. In this alternate embodiment, the atomic voltage regulators are operated simultaneously. In either embodiment, the atomic charge sources may be physically distributed across the integrated circuit.

BRIEF DESCRIPTION OF THE DRAWINGS

The present invention may be more fully understood by a description of certain preferred embodiments in conjunction with the attached drawings in which:

FIG. 2b is a plot of reference voltage as a function of physical location in the prior art memory array of FIG. 2a;

FIG. 3b is a plot of reference voltage as a function of physical location in the tiled memory array of FIG. 3a;

PIG. 16 illustrates an integrated circuit device designed in accordance with an alternative embodiment of the present invention.

DETAILED DESCRIPTION OF THE PREFERRED EMBODIMENTS

The present invention provides a memory tile having its own charge source circuitry. In one embodiment, a plurality of the memory tiles are combined to form a tiled memory array in a stand alone memory device. In an alternative embodiment, a plurality of memory tiles are combined to form a tiled memory array in an integrated circuit having an embedded memory.

Figure 1:
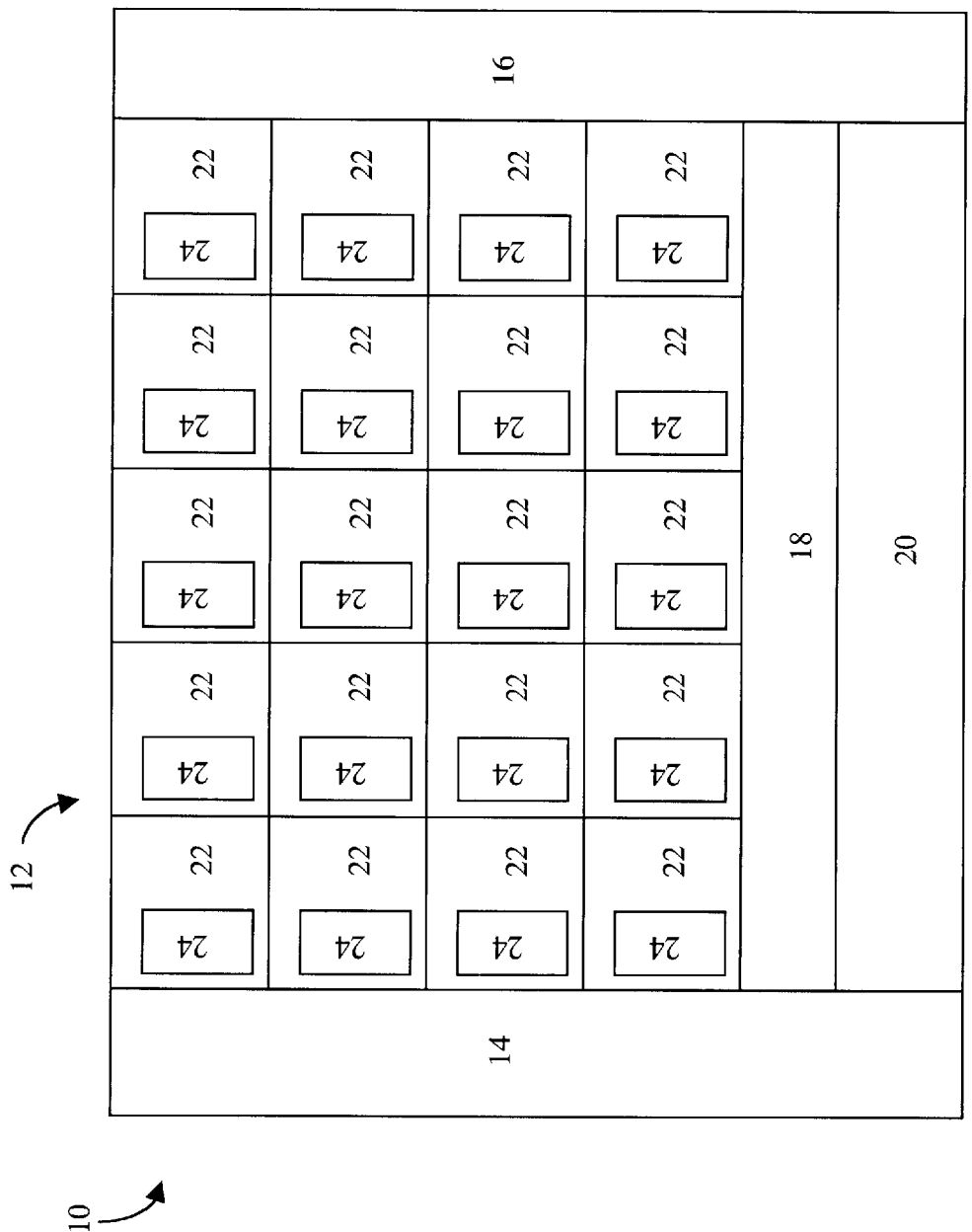
FIG. 1 illustrates in block diagram form a tiled memory device designed in accordance with one embodiment of the present invention.

FIG. 1 illustrates, in block diagram form, a tiled memory device 10 that is in accordance with one embodiment of the present invention. In this particular embodiment, tiled memory device 10 includes a tiled memory array 12, fuse circuitry 14, error detection and correction circuitry 16, test circuitry 18, and memory interface circuitry 20.

Fuse circuitry 14 is coupled to tiled memory array 12 and is used to repair defects within tiled memory array 12. Error detection and correction circuitry 16 is coupled to tiled memory array 12 and detects and corrects errors within tiled memory array 12. Note, error detection and correction circuitry 16 may be used to correct soft or hard errors. Test circuitry 18 is coupled to tiled memory array 12 and is used to test tiled memory array 12. In one embodiment, test circuitry 18 is built-in self-test (BIST) circuitry. In an alternative embodiment, test circuitry is built-in self-repair (BISR) circuitry. In another embodiment, test circuitry 18 includes both BIST circuitry and BISR circuitry. Memory interface circuitry 20 is coupled to tiled memory array 12 and contains circuitry which allows tiled memory array 12 to interface with logic circuitry external to tiled memory device 10. More specifically, memory interface circuitry 20 contains circuitry which allows tiled memory array 12 to interface with different external logic architectures. For example, if tiled memory array 12 is to interface with an advanced RISC microprocessor, referred to as an ARM microprocessor, then memory interface circuitry 20 includes circuitry which allows the memory tiles 22 within tiled memory array 12 to be selectively coupled to the ARM microprocessor. In one embodiment, memory interface circuitry 20 includes a DRAM controller. In an alternative embodiment memory interface circuitry 20 includes refresh control circuitry which allows tiled memory array 12 to interface with external logic. In another embodiment memory interface circuitry 20 includes circuitry which controls the power consumption of tiled memory array 12, and thus allows tiled memory array 12 to interface with external logic. Note, tiled memory array 12 includes a plurality of memory tiles 22, and each memory tile 22 contains a plurality of memory cells and its own charge source circuitry 24.

Figure 2A:
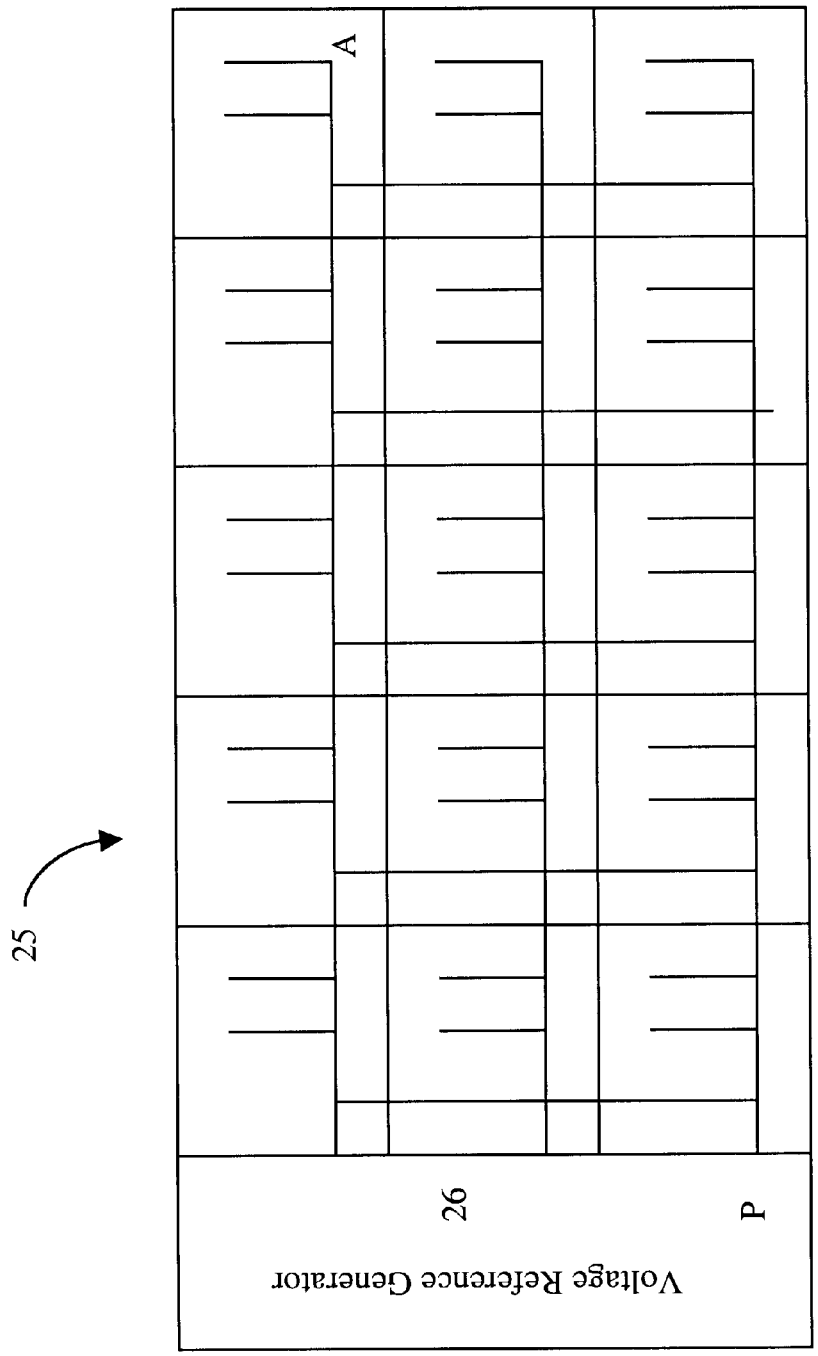
FIG. 2a illustrates a portion of a prior art memory array.

Shown in FIG. 2a, is a portion of a prior art memory array 25. Note that in the prior art a single voltage reference generator 26 supplies the entire memory array 25 with a reference voltage, as shown in FIG. 2a. A point "P" is provided as a locational reference within the voltage reference generator 26 and a point "A" is provided as a locational reference within the memory array 25. Points P and A will be used to illustrate degradation of the source voltage as a function of distance from the source, as illustrated in FIG. 2b.

Figure 2B:
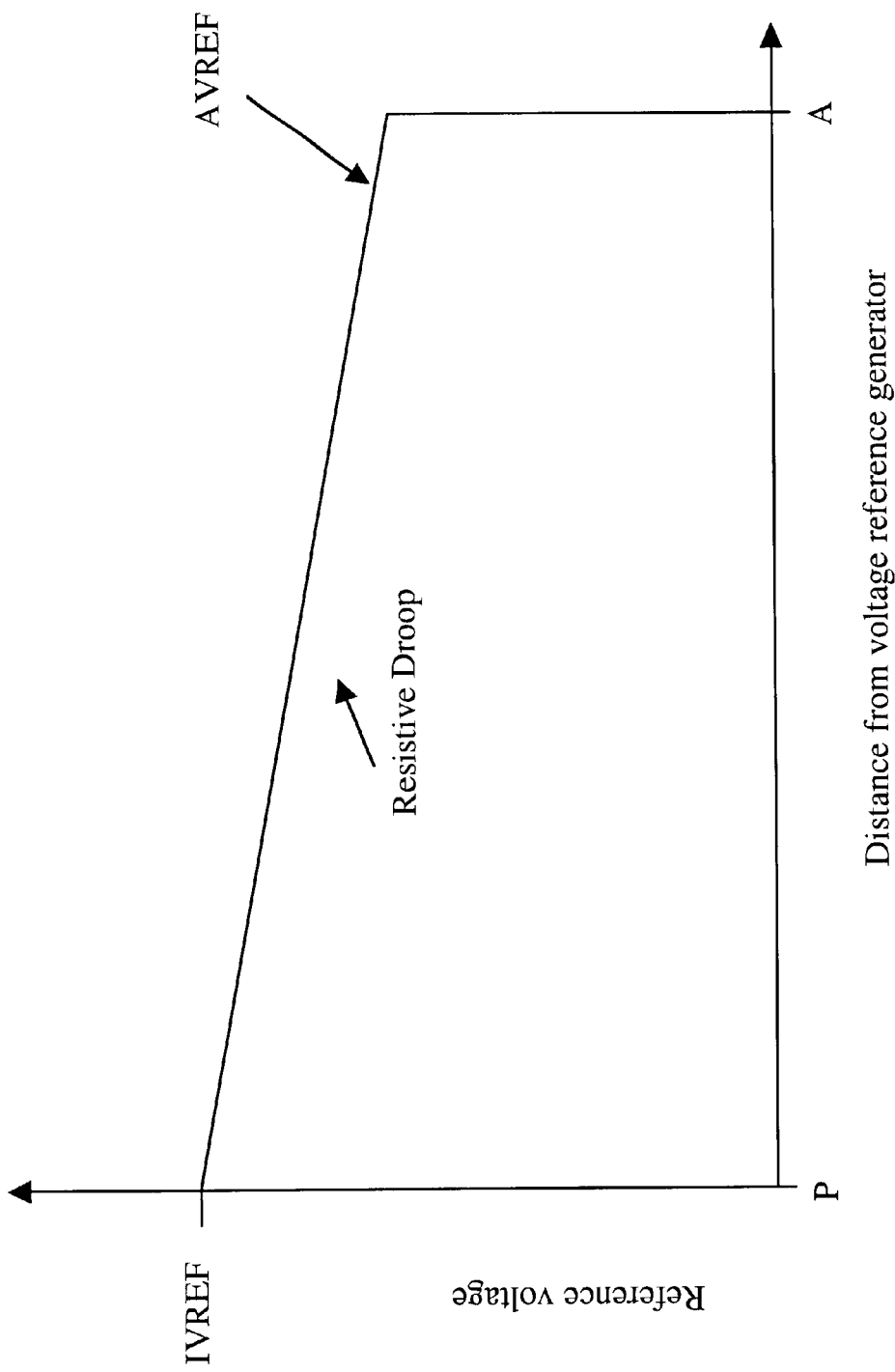

Shown in FIG. 2b, is a plot of reference voltage as a function of location for the prior art memory array of FIG. 2a. The horizontal axis represents physical distance from point P to point A within the memory array 25 of FIG. 2a. The vertical axis represents reference voltage. An intended reference voltage, or design reference voltage is indicated on the vertical axis as IVREF. The actual reference voltage (AVREF), as measured within the memory array 25, is plotted as a function of distance from the voltage reference generator. Note that at point P the actual reference voltage (AVREF) is equal to the intended reference voltage (IVREF) as expected. However, at point A within the memory array AVREF is less than IVREF. This voltage differential is known as a "resistive droop," and is due to interconnect resistance. As the distance between the voltage reference generator and a specific location in the memory array increases, interconnect resistance between the two points increases, and this results in the two points having different voltages, as shown in FIG. 2b (i.e. degradation of AVREF).

Figure 3A:
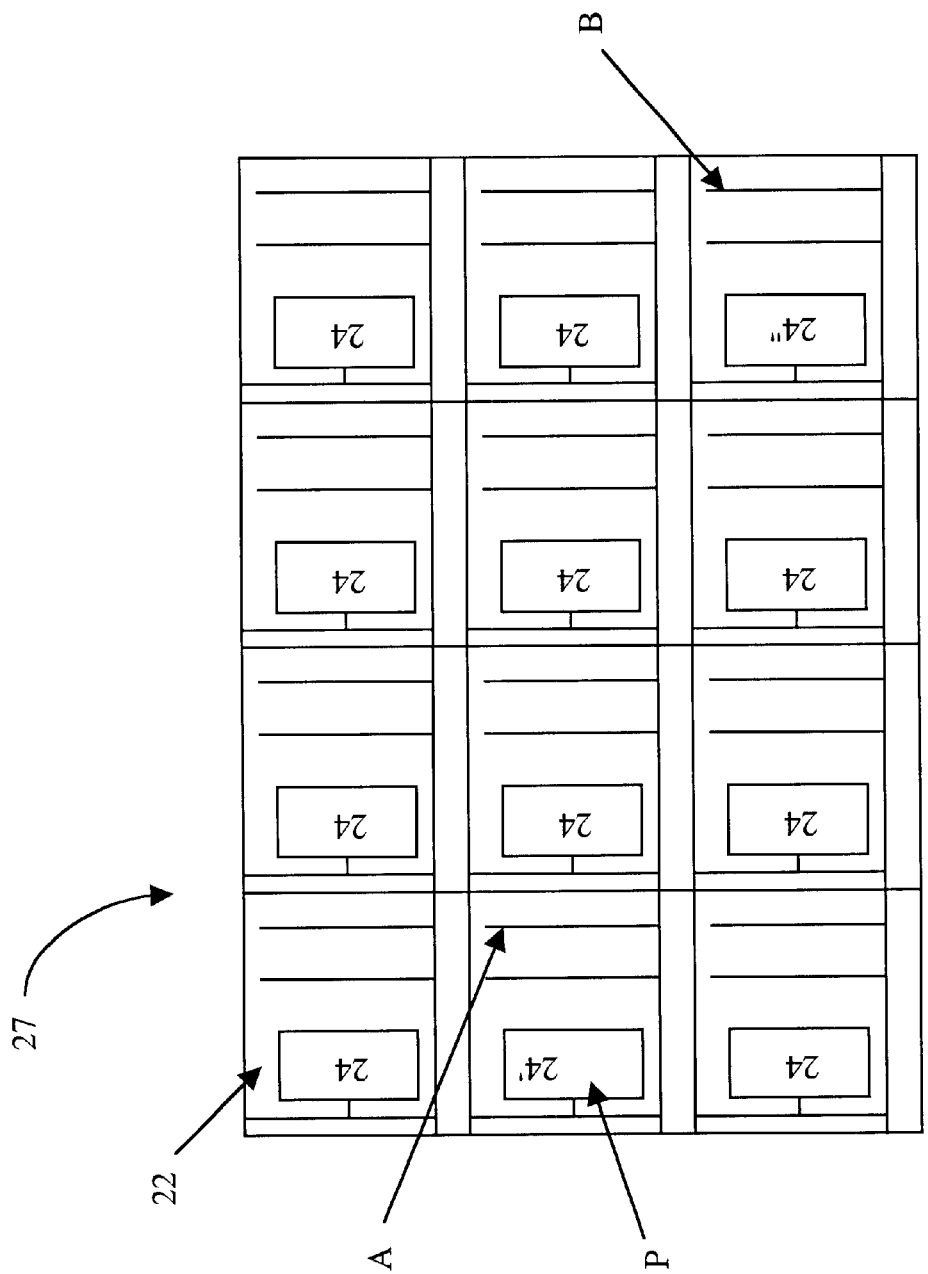
FIG. 3a illustrates a portion of a tiled memory array designed in accordance with one embodiment of the present invention.

Shown in FIG. 3a, is a portion 27 of tiled memory array 12, in accordance with one embodiment of the present invention. As previously described, each memory tile 22 within tiled memory array 12 contains its own charge source circuitry 24. A point "P" is provided as a locational reference within the charge source circuitry 24'. Points "A" and "B" are provided as locational references within the portion 27. Points P, A and B will be used to illustrate degradation of the source voltage as a function of distance from the source, as illustrated in FIG. 3b.

Figure 3B:
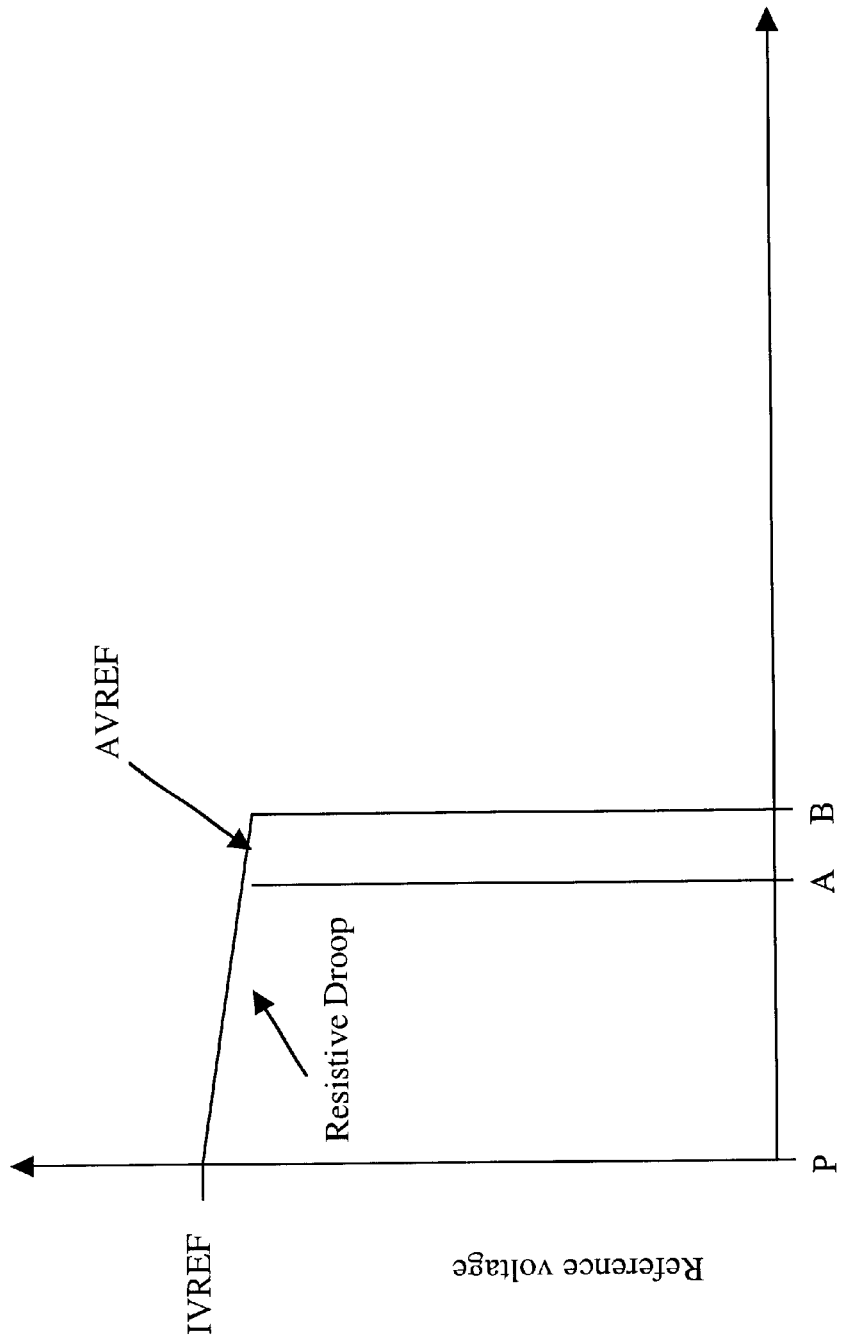

Shown in FIG. 3b, is a plot of reference voltage as a function of location for portion 27 of FIG. 3a. The horizontal axis represents physical distance from point P to points A and B within the portion 27 of FIG. 3a. The vertical axis represents reference voltage. As in FIG. 2b, an intended reference voltage, or design reference voltage is indicated on the vertical axis as IVREF. The actual reference voltage (AVREF), as measured within the portion 27, is plotted as a function of distance from the voltage reference generator. Note that at point P the actual reference voltage (AVREF) is equal to the intended reference voltage (IVREF) as expected. Moreover, at point A within the memory array AVREF is still nearly equal to IREF. This occurs because the distance between point A and charge source circuitry 24' is small, and thus the resistance between these two points is also small. Furthermore, at point B within the memory array AVREF is still nearly equal to IVREF. This occurs because charge source circuitry 24" is primarily responsible for supplying point B with a reference voltage, not charge source circuitry 24'. Thus, we have found that "resistive droop" within tiled memory array 12 is minimized because each memory tile 22 contains its own charge source circuitry 24.

It should also be appreciated that a further advantage of the present invention is that the charge source circuitry of each memory tile in the tiled memory array can be connected to together. Therefore, if the charge source circuitry within a particular memory tile does not function properly, it can be compensated for by the charge source circuitry of the surrounding memory tiles in the tiled memory array. In this way, if charge source circuitry 24' is defective, charge maybe sourced from the multiple surrounding charge source circuitry 24.

Figure 4:
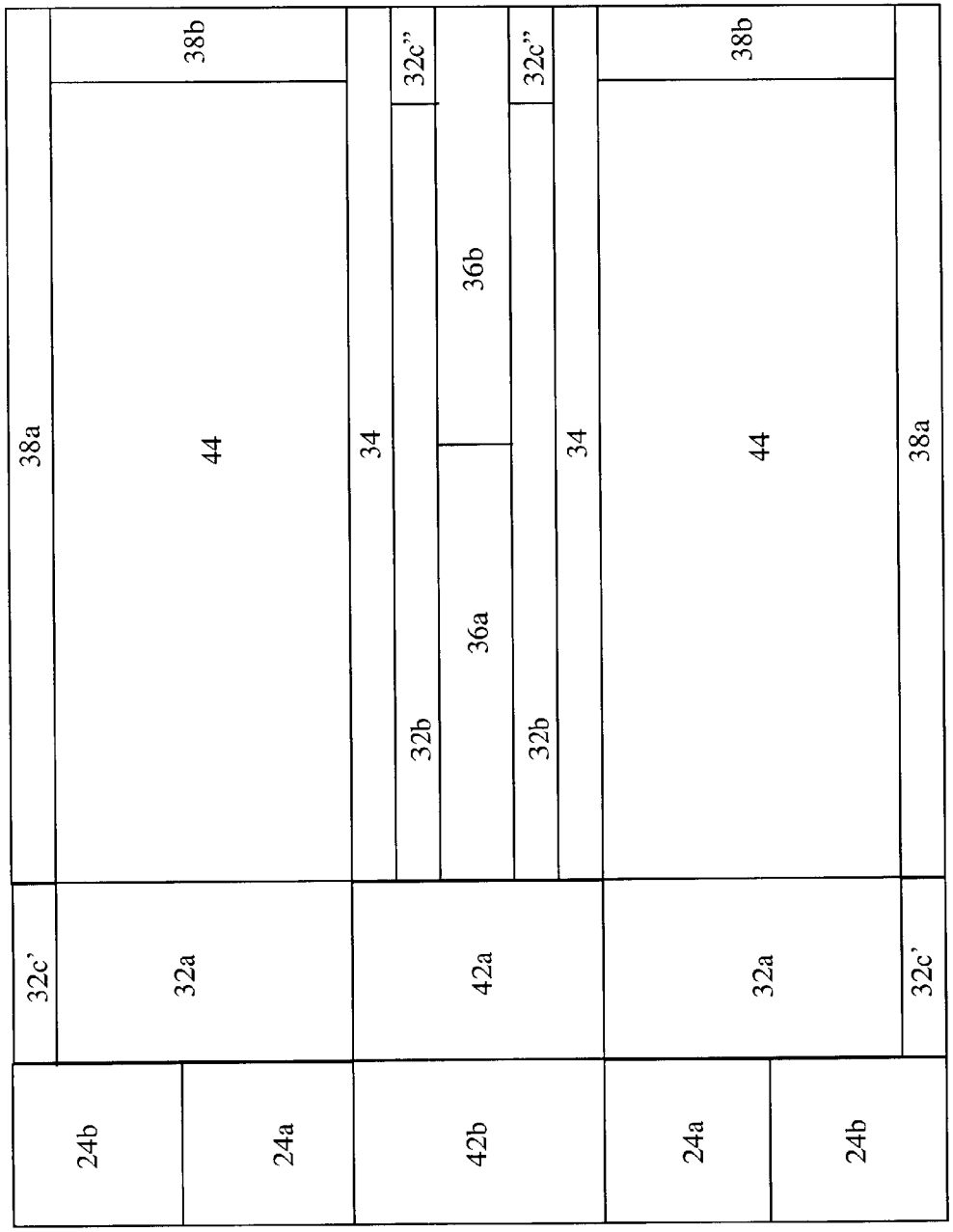
FIG. 4 illustrates in block diagram form a memory tile designed in accordance with one embodiment of the present invention.

FIG. 4 illustrates in block diagram form memory tile 22 of FIG. 1, which is in accordance with one embodiment of the present invention. In this particular embodiment, memory tile 22 includes address decode circuitry 32a, 32b, 32c', 32c", sense amplifier circuitry 34, data input/output circuitry 36, redundancy circuitry 38a and 38b, charge source circuitry 24a, voltage level detector 24b, access control logic circuitry 42a, 42b, and memory cells 44. Memory cells 44 maybe dynamic random access memory (DRAM) cells, static random access memory (SRAM) cells, ferroelectric random access memory (FeRAM) cells, magnetoresistive random access memory (MRAM) cells, or electrically erasable read only memory (EEPROM) cells, read only memory (ROM) cells, or other memory cells which are arranged in an array of rows and columns, and randomly accessible.

Access control logic circuitry includes address buffers 42a and timing logic 42b. Access control logic circuitry 42a, 42b are coupled to memory cells 44 and controls accessing of memory cells 44 via address decode circuitry 32a and sense amplifier circuitry 34. It should be appreciated, that if memory cells 44 are DRAM cells, then access control logic circuitry 42a, 42b may also include refresh control circuitry (not shown) which controls refresh of the DRAM cells.

Address decode circuitry includes row decode circuitry 32a, column decode circuitry 32b, and redundancy control logic 32c, which includes row redundancy control logic 32c' and column redundancy control logic 32c". Address decode circuitry 32 is coupled to memory cells 44 and to memory interface circuitry 20 of FIG. 1. During operation, address decode circuitry 32 receive an address from an external logic device, such as an ARM microprocessor, via memory interface circuitry 20 and address buffers 42a. In response to receiving this address, address decode circuitry 32 selectively couple one of the memory cells within memory cells 44 to the external logic device via sense amplifier circuitry 24, data input/output circuitry 36 and memory interface circuitry 20.

Redundancy circuitry 38 includes redundant rows of memory cells 38a and redundant columns of memory cells 38b, and is coupled to address decode circuitry. More specifically, row redundancy control logic 32c' is coupled to the redundant rows of memory cells 38a and column redundancy control logic 32c" is coupled to the redundant columns of memory cells 38b. Note, that if redundancy control logic 32c receives a redundancy control signal from external logic, then redundancy control logic 32c allows a redundant memory cell within redundancy circuitry 38a, 38b to be addressed by external logic, in place of a selected memory cell within memory cells 44. More specifically, if row redundancy control logic 32c' receives a row redundancy control signal from external logic, then row redundancy control logic 32a' allows a redundant row of memory cells within redundant rows of memory cells 38a to be addressed by external logic, in place of a selected row of memory cells within memory cells 44. Similarly, if column redundancy control logic 32c" receives a column redundancy control signal from external logic, then column redundancy control logic 32c" allows a redundant column of memory cells within redundant columns 38a to be addressed by external logic, in place of a selected column of memory cells within memory cells 44.

Data input/output circuitry 36 includes data buffers 36a and fault logic 36b. Data input/output circuitry 36 is used to read data from or write data to sense amplifier circuitry 34. Data buffers 36a are also coupled to memory interface circuitry 20. Fault logic 36b, which may include error correction logic, is coupled between sense amplifier circuitry 34 and memory interface circuitry 20. According to one embodiment, fault logic 36b detects single and double bit errors within memory cells 44, and corrects single bit errors within memory cells 44.

Sense amplifier circuitry 34 is coupled between memory cells 44 and data buffers 36a. Sense amplifier circuitry 34 is used to read data from and write to memory cells 44.

Charge source circuitry includes charge source 24a and voltage level detector 24b. Charge source circuitry provides all reference voltages required by memory tile 22. For example, if memory tile 22 includes a boosted wordline driver, then charge source circuitry provides the reference voltage for the boosted wordline driver. Similarly, if memory tile 22 includes dynamic memory cells, then charge source circuitry 24 provides a voltage reference for a capacitor plate voltage in the dynamic memory cells. In addition, if memory tile 22 includes a well region which is biased to reduce noise or reduce soft error rate, then charge source circuitry 24 provides the voltage reference for biasing the well region. Furthermore, if memory tile 22 includes logic for reducing the power consumption within memory tile 22, then charge source circuitry 24 provides the reference voltage for this logic.

Figure 5A:
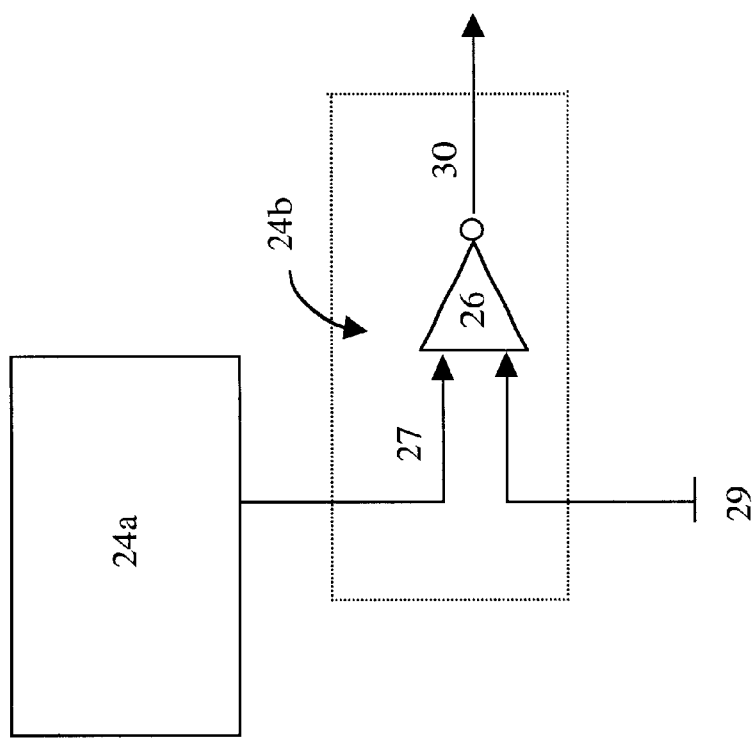
FIG. 5a illustrates in partial logic diagram and partial block diagram form a charge source and voltage level detector of the memory tile of FIG. 4 in accordance with one embodiment of the present invention.

FIG. 5a illustrates in partial logic diagram form and partial block diagram form charge source 24a and voltage level detector 24b of FIG. 4, in accordance with one embodiment of the present invention. In this particular embodiment, voltage level detector 24b includes comparator 26. Charge source 24a provides a reference signal 27 to a first input of comparator 26. A second input of comparator 26 is coupled to a reference signal 29, and the output of comparator 26 is coupled to output signal line 30. Comparator 26 compares reference signal 27 to reference signal 29. If the difference between the two signals is more than a predetermined value, then comparator 26 provides an output signal to output signal line 30. Thus, voltage level detector 24b detects whether or not charge source 24a is operating correctly. In one embodiment, voltage level detector 24b produces an output signal which disables charge source 24a when voltage level detector 24b detects that charge source 24a is operating incorrectly. In an alternative embodiment, voltage level detector 24b provides an output signal to external logic when it detects that charge source 24a is operating incorrectly. In this case, the output signal may be used to inform external logic that a particular memory tile is not addressable because its charge source is defective. The embodiment illustrated in FIG. 5a provides an exemplar providing a first logical level output when the difference between signals 27 and 29 is in a first voltage range and the opposite logical level when the difference is outside of the first voltage range. Alternate embodiments may employ an alternate logical scheme to provide operating condition information. Alternate embodiments may employ multiple voltage ranges and provide multiple output indications, such a warning of an impending failure.

Figure 5B:
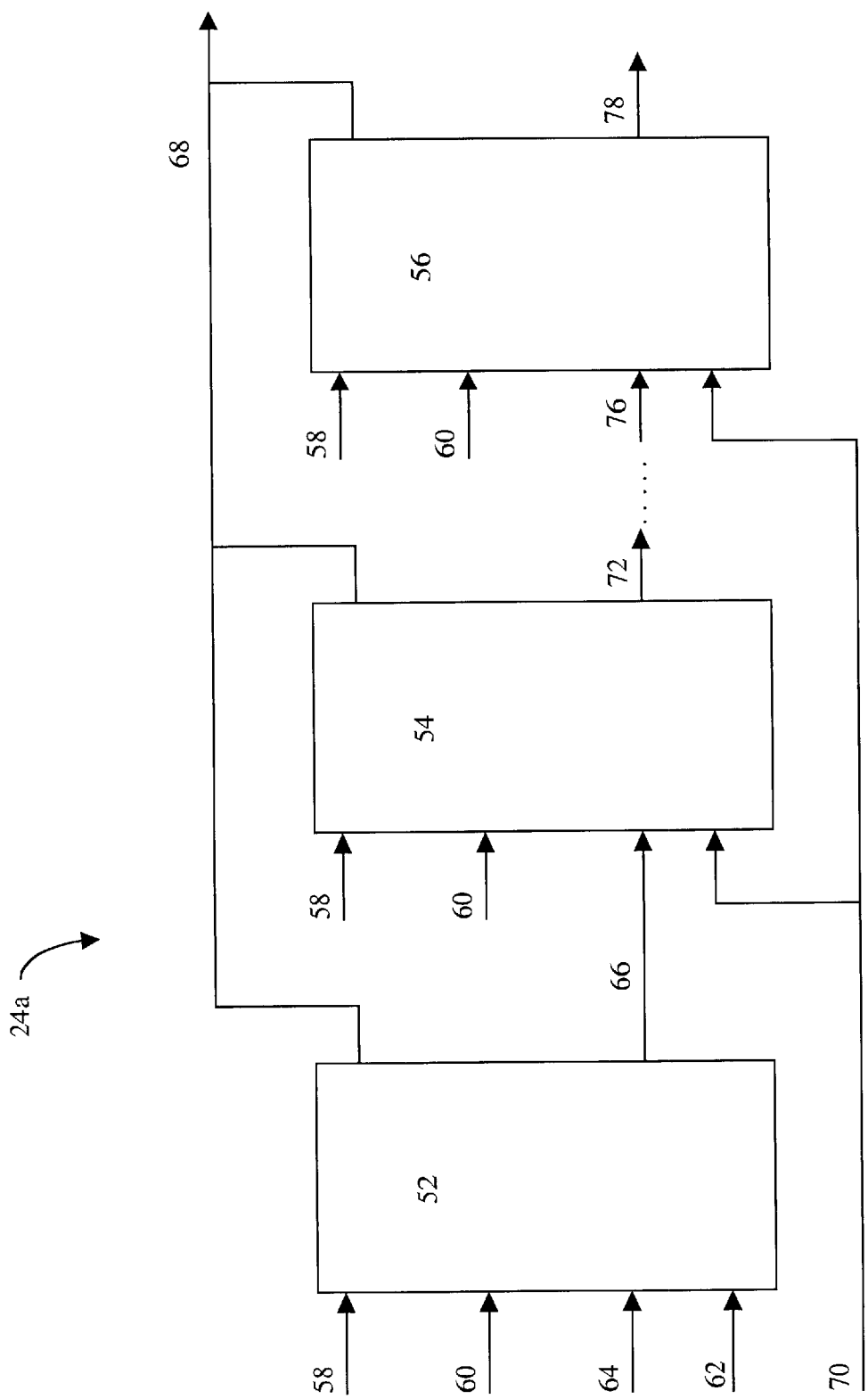
FIG. 5b illustrates in block diagram form a charge source designed in accordance with one embodiment of the present invention.

FIG. 5b illustrates in block diagram form one embodiment of charge source 24a of FIG. 4, which is in accordance with the present invention. In this particular embodiment, charge source 24a includes N atomic charge pumps, where N is equal to or greater than one. The N atomic charge pumps are ganged or connected together in series to form a distributed charge pump. It should be appreciated that the actual number of atomic charge pumps within charge source 24a will depend upon the load which is to be driven by charge source 24a. In FIG. 5b, atomic charge pump 52 is the first stage of the distributed charge pump, atomic charge pump 54 is the second stage of the distributed charge pump, and atomic charge pump 56 is the Nth stage or Nth atomic charge pump in the distributed charge pump.

A first power supply potential 58 is coupled to a first input of atomic charge pump 52, a second power supply potential 60 is coupled to a second input of atomic charge pump 52, an enable signal 62 is coupled to a third input of atomic charge pump 52, and a clock signal 64 is coupled to a fourth input of atomic charge pump 52. A first output of atomic charge pump 52 is coupled to reference signal 68. A second output of atomic charge pump 52 provides a clock signal 66 as an output.

The first power supply potential 58 is coupled to a first input of atomic charge pump 54, the second power supply potential 60 is coupled to a second input of atomic charge pump 54, an enable signal 70 is coupled to a third input of atomic charge pump 54, and clock signal 66 from atomic charge pump 52 is coupled to a fourth input of atomic charge pump 54. A first output of atomic charge pump 54 is coupled to reference signal 68. A second output of atomic charge pump 54 provides clock signal 72 as an output. The clock signal 72 from atomic charge pump 54 is provided as input to the next stage atomic charge pump (not shown).

The first power supply potential 58 is coupled to a first input of atomic charge pump 56, the second power supply potential 60 is coupled to a second input of atomic charge pump 56, the enable signal 70 is coupled to a third input of atomic charge pump 56, and a dock signal 76 is coupled to a fourth input of atomic charge pump 56. The clock signal 76 is received from the previous stage atomic charge pump (not shown). A first output of atomic charge pump 56 is coupled to reference signal 68. A second output of atomic charge pump 56 provides clock signal 78 as an output.

It should be appreciated that charge source 24a reduces supply signal noise. More specifically, we have found that by ganging the atomic charge pumps together and operating them sequentially over time, supply signal noise can be reduced. This occurs because noise created when each charge pump turns on is distributed over time so that noise in the supply or reference signal is spread out over time. It should also be appreciated that charge source 24a also allows power consumption within memory tile 22 to be reduced because portions of charge source 24a can be independently powered down. For example, in FIG. 5b, atomic charge pump 54 and atomic charge pump 56 may be powered down via enable signal 70, while atomic charge pump 52 may be left on via enable signal 62. Thus, with our invention the number of atomic charge pumps operating sequentially is selectable because a subset of the N atomic charge pumps within charge source 24a can be powered down. The embodiment illustrated in FIG. 5b provides a single enable signal 70 to all but atomic charge pump 52. Alternate embodiments may implement the enable signal so as to allow combinations of atomic charge pumps.

Figure 6:
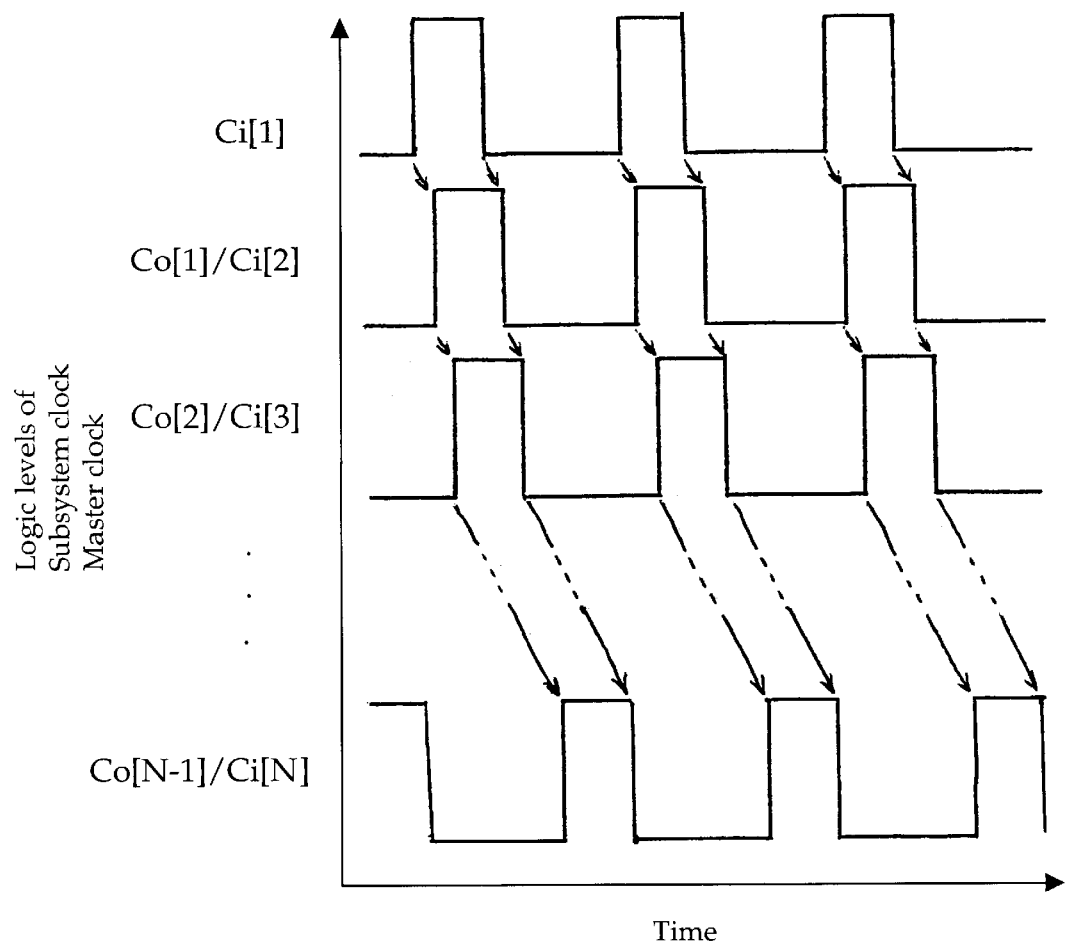
FIG. 6 illustrates a timing diagram for the charge source of FIG. 5b, operated in accordance with one embodiment of the present invention.

Shown in FIG. 6, is a timing diagram for charge source 24a of FIG. 5b, in accordance with one embodiment of the present invention. The horizontal axis represents time, and the vertical axis represents logic levels of clock signals associated with the charge source 24a. Referring again to FIG. 5b, each atomic charge pump 52, 54, . . . 56, has an associated clock input signal 64, 66, . . . 76, respectively, and an associated dock output signal 66, 72, . . . 78, respectively. The input clock signal 64 for the first stage is indicated on the plot of FIG. 6 as Ci[1], where Ci indicates an input dock and the index value in square brackets indicates the stage of the distributed charge pump. Similarly, the output dock signal 66 is indicated as Co[1], where Co indicates an output clock and the index value in square brackets indicates the stage of the distributed charge pump. Note that Co[1], the output clock signal 66 for stage one is the input clock signal 66 for stage two. As such, this signal is only plotted once in FIG. 6. The second stage output clock signal 72 is also illustrated and is indicated by Co[2]. The input clock signal 76 to stage N is indicated as Ci[N].

Specifically, FIG. 6 illustrates how subsequent atomic charge pump stages within charge source 24a are clocked with respect to the initial atomic charge pump stage within charge source 24a. Note, the atomic charge pumps within charge source 24a are prevented from firing at the same time because charge source 24a utilizes a sequential clocking delay scheme, as shown in FIG. 6. For example, the input clock 66 to the second stage is delayed from the input clock 64 to the first stage, as the input clock 66 is generated by the first stage. Each stage has such a relationship with subsequent stages.

Figure 7:
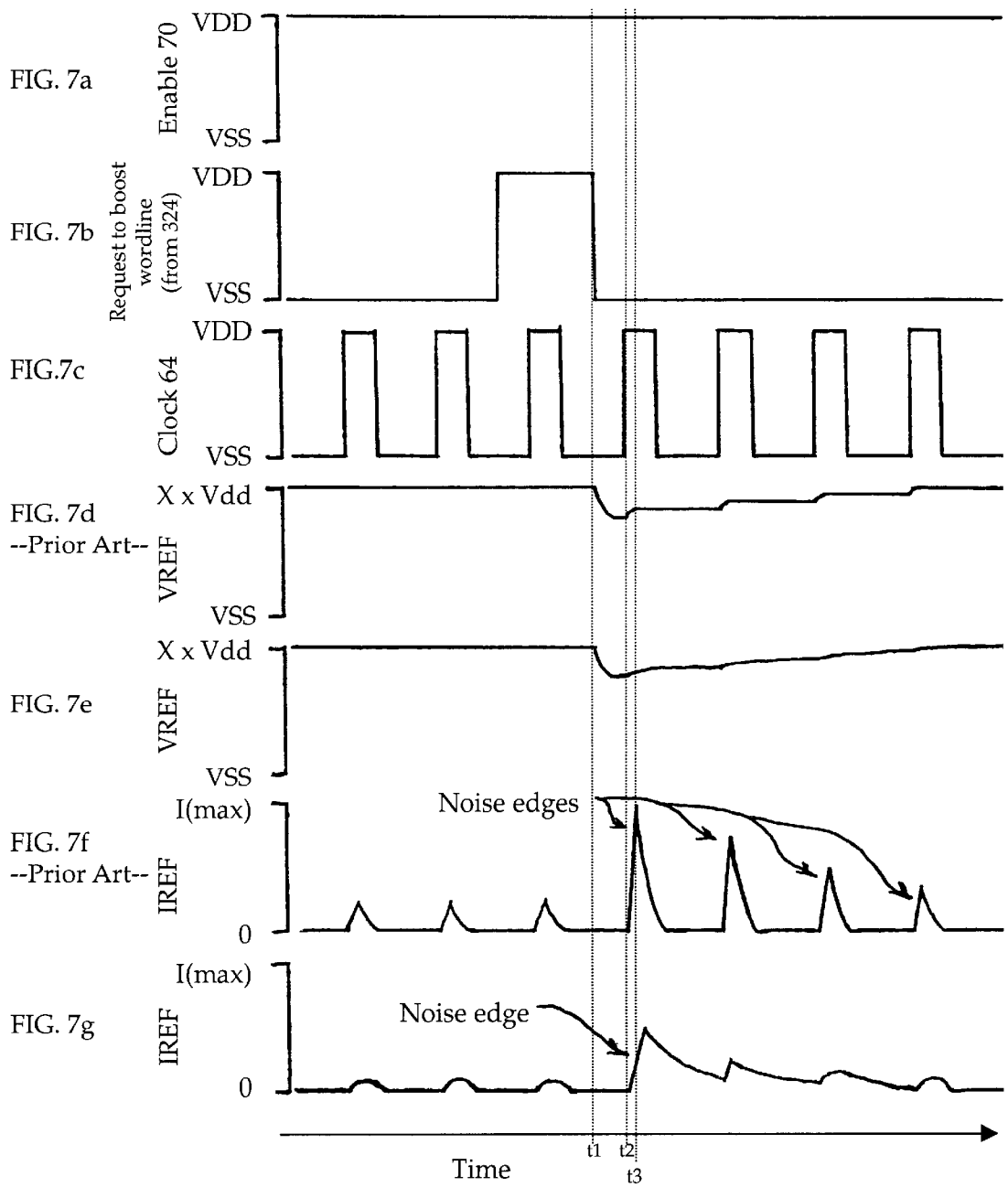
FIGS. 7a–7g illustrate timing diagrams for the charge source of FIG. 5b, operated in accordance with one embodiment of the present invention.

Shown in FIGS. 7a to 7g, are timing diagrams for charge source 24a of FIG. 5b, in accordance with one embodiment of the present invention. In FIGS. 7a to 7g, the reference current noise and the reference voltage for a prior art charge pump, are compared with the reference current noise and the reference voltage of charge source 24a. More specifically, FIGS. 7a to 7g illustrate how the sequential clocking of the atomic charge pumps within charge source 24a effects reference current noise and reference voltage, as compared to the prior art. The horizontal axis for the signals illustrated in FIGS. 7a to 7g represents time. The vertical axes for FIGS. 7a to 7E represent the voltage levels of various signals within the charge source 24a. The vertical axes for FIGS. 7f and 7g represent current measurements of the power supply 58 to charge source 24a.

For the condition of FIG. 7a, the enable signal 70 is asserted therefore the N atomic charge sources are all enabled. Enable is asserted by a logical high level at a first supply voltage VDD with reference to a second supply voltage VSS. FIG. 7b illustrates a request to boost the wordline, where the request signal is asserted at time t1. The request is asserted by a logical low level voltage. Note that the request is such as a request by row decoder 32a of FIG. 4. Continuing, FIG. 7c is a plot of the input dock, such as dock 64 to the first stage of the charge source 24a. FIG. 7d illustrates the reference voltage generated in a prior art device such as by voltage reference generator 26 of FIG. 2a. Indicated on the vertical axis is a multiple of the supply voltage VDD, and a second voltage reference VSS. Note that in the prior art reference, in response to assertion of a request signal at a time t1, such as illustrated in FIG. 7b, the voltage drops below its prerequest level. Multiples of Vdd typically used in DRAMs include 2×VDD, 0.5×VDD, and/or −0.5× VDD. FIG. 7e illustrates the reference voltage generated by the charge source 24a according to one embodiment of the present invention illustrated in FIG. 5b. In response to assertion of the request signal at time t1 the reference voltage signal 68 drops below its prerequest level.

Associated with the conditions illustrated in FIGS. 7a to 7e is a current behavior associated with each power supply. FIG. 7f illustrates the current behavior of the prior art device, and FIG. 7g illustrates the current behavior of one embodiment of the present invention. In FIG. 7g, the reference current is measured at the first power supply 58 of FIG. 5b. Note that in both the prior art device and the present invention, there is a current spike associated with each occurrence of the input clock. Note also that the input clock in both the prior art device and the present invention indicates a need to supply charge. As illustrated in FIGS. 7f and 7g, a current spike starts at time t2 in response to assertion of the request signal. The current spike hits a maximum current at time t3. Note that the current spike of the present invention is greatly reduced from the current spike of the prior art device. Subsequent to time t2, a current spike is created with each occurrence of the clock of FIG. 7c. Here again, the current spikes of the present invention are greatly reduced from the current spike of the prior art device. Similarly, referring again to FIGS. 7d and 7e, the behavior of the voltage reference subsequent to time t2 tends to drift back toward the prerequest level. However, the voltage reference of the prior art device is not as smooth as the voltage reference signal 68 of the present invention. Note that the behaviors illustrated in FIGS. 7a to 7g is exemplar of any conditions and operations which request of a charge demand for plate voltage in DRAM or back body supply for well of the DRAM, or any other increased demand for charge. The noise also effects retention time for a DRAM, and may cause electromagnetic interference. The present invention greatly reduces the noise and reduces the effect of noise on the electromagnetic interference (EMI) signature by spreading the noise spectrum.

Shown in FIGS. 8a–8g is another timing diagram for charge source 24a of FIG. 5b, in accordance with one embodiment of the present invention. In FIGS. 8a–8g, the reference current noise and the reference voltage noise for a prior art charge pump, is compared with the reference current noise and the reference voltage noise of charge source 24a. More specifically, FIGS. 8a–8g illustrates how enablement of the atomic charge pumps within charge source 24a effects reference current noise and reference voltage noise, as compared to the prior art.

Figure 8:
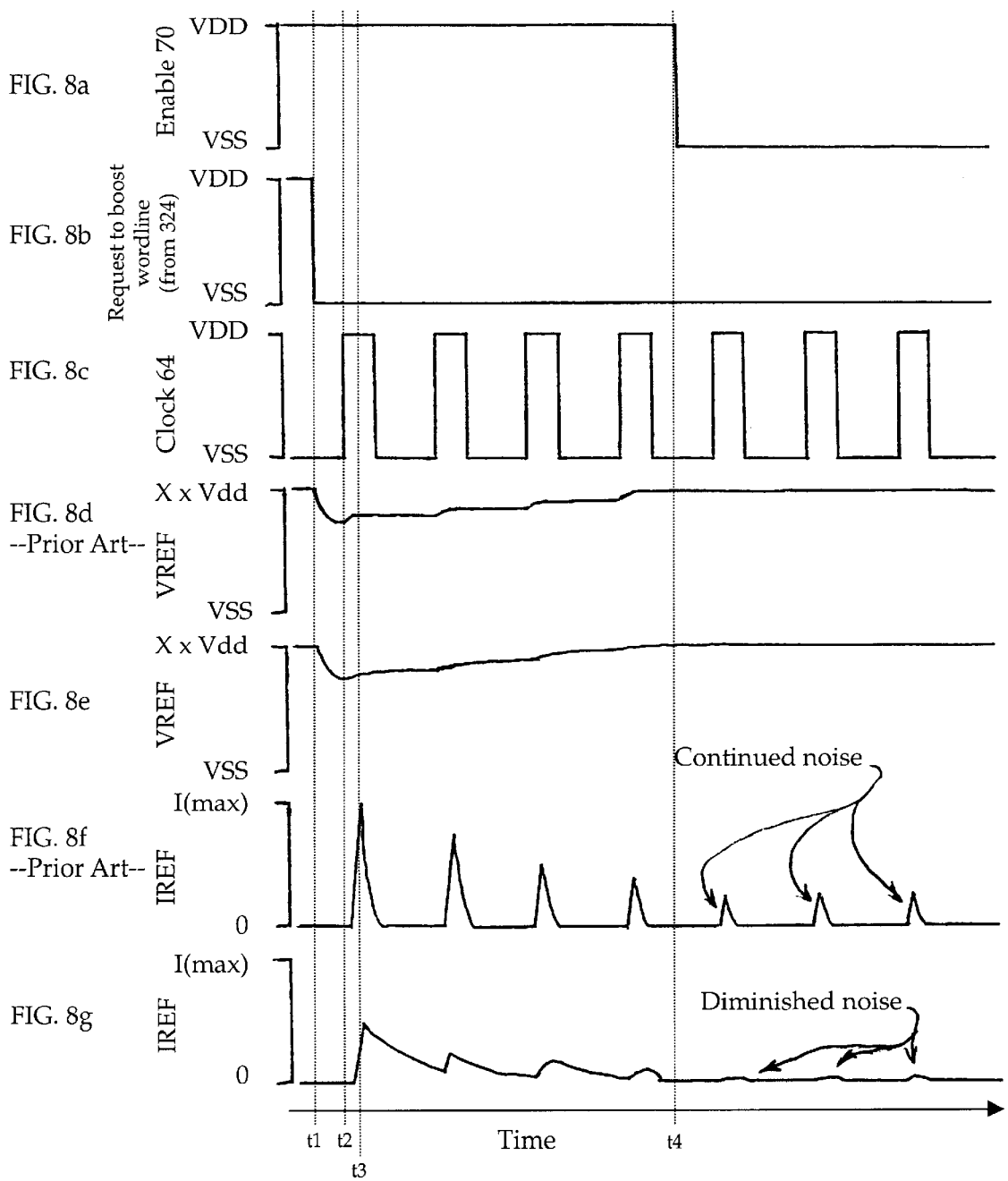
FIG. 8a–8g illustrate timing diagrams for the charge source of FIG. 5b, operated in accordance with one embodiment of the present invention.

For the condition of FIG. 8a, the enable signal 70 is asserted prior to t2, where the N atomic charge sources are all enabled, and the enable signal 70 is disabled at time t4. Enable is asserted by a logical high level at a first supply voltage VDD with reference to a second supply voltage VSS, and negated by a logical low level. Similar to FIG. 7b, FIG. 8b illustrates a request to boost the wordline, where the request signal is asserted at time t1. The request is asserted by a logical low level voltage. Note that the request is such as a request by row decoder 32a of FIG. 4. Continuing, FIG. 8c is a plot of the input clock, such as clock 64 to the first stage of the charge source 24a. FIG. 8d illustrates the reference voltage generated in a prior art device such as by voltage reference generator 26 of FIG. 2a. Indicated on the vertical axis is a multiple of the supply voltage VDD, and a second voltage reference VSS. Note that in the prior art reference, in response to assertion of a request signal at a time t1, such as illustrated in FIG. 8b, the voltage drops below its prerequest level. FIG. 8e illustrates the reference voltage generated by the charge source 24a according to one embodiment of the present invention illustrated in FIG. 5b. In response to assertion of the request signal at time t1 the reference voltage signal 68 drops below its prerequest level.

Associated with the conditions illustrated in FIGS. 8a to 8e is a current behavior associated with each power supply. FIG. 8f illustrates the current behavior of the prior art device, and FIG. 8g illustrates the current behavior of one embodiment of the present invention. In FIG. 8g, the reference current is measured at the first power supply 58 of FIG. 5b. Note that in both the prior art device and the present invention, there is a current spike associated with each occurrence of the input clock. Note also that the input clock in both the prior art device and the present invention indicates a need to supply charge. As illustrated in FIGS. 8f and 8g, a current spike starts at time t2 in response to the rising edge of the clock after assertion of the request signal. The current spike hits a maximum current at or about time t3. Note that the current spike of the present invention is greatly reduced from the current spike of the prior art device. Subsequent to time t3, a current spike is created with each occurrence of the clock of FIG. 8c. Here again, the current spikes of the present invention are greatly reduced from the current spikes of the prior art device. Similarly, referring again to FIGS. 8d and 8e, the behavior of the voltage reference subsequent to time t3 tends to drift back toward the prerequest level. However, the voltage reference of the prior art device is not as smooth as the voltage reference signal 68 of the present invention. Note that the behaviors illustrated in FIGS. 8a to 8g is exemplar of any conditions and operations which request of a charge demand for plate voltage in DRAM or back body supply for well of the DRAM, or any other increased demand for charge.

FIGS. 8f and 8g illustrate another advantage of the present invention, where it is possible to disable atomic charge sources and thus reduce the current further. This is clearly seen subsequent to time t4 where the enable signal 70 is negated and the atomic charge sources are disabled. The effect of disabling the atomic charge sources is to greatly diminish the current level, as illustrated in FIG. 8g. The current spikes are referred to as noise edges and are detrimental in battery operated system as they draw excess power. The present invention overcomes the detrimental effects of the noise spikes by reducing the amplitude of the current overall, and also by allowing portions of the distributed charge pump to be disabled.

Figure 9:
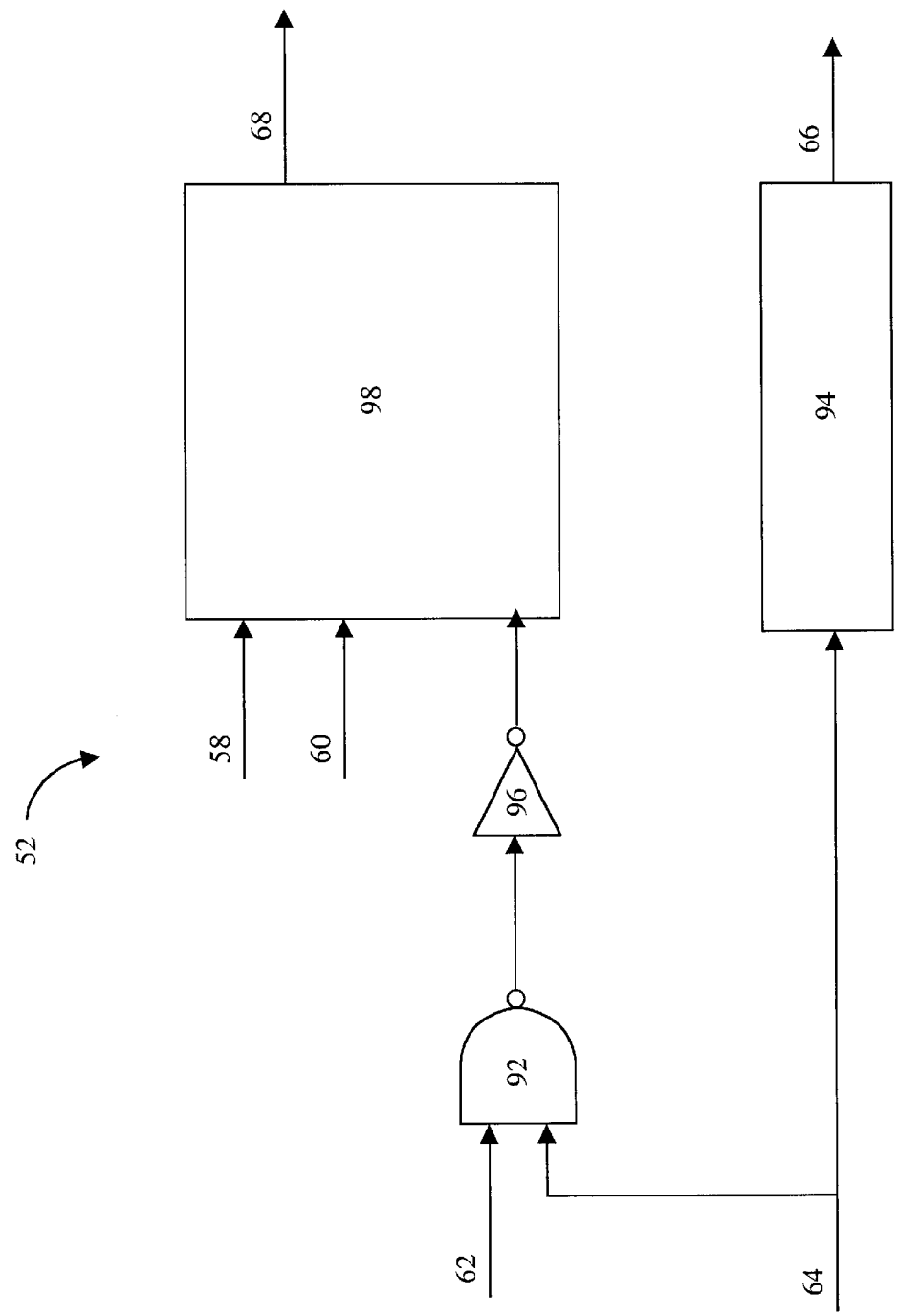
FIG. 9 illustrates in partial logic diagram form and partial block diagram form an atomic charge pump designed in accordance with one embodiment of the present invention.

FIG. 9 illustrates in partial logic diagram form and partial block diagram form atomic charge pumps 52 of FIG. 5b, which is in accordance with one embodiment of the present invention. In this particular embodiment, atomic charge pump 52 includes a NAND gate 92, a delay circuit 94, an inverter 96, and pump circuitry 98. NAND gate 92 receives enable signal 62 and clock signal 64 as inputs. The output of NAND gate 92 is coupled to the input of inverter 96. The output of inverter 96 is coupled to pump circuitry 98. The first power supply potential 58 and the second power supply potential 60 are coupled to pump circuitry 98. The output of pump circuitry 98 is coupled to reference signal 68. Delay circuit 94 also receives clock signal 64 as an input and provides clock signal 66 as an output.

Note, that atomic charge pump 54 may be formed in a similar manner. In this case NAND gate 92 would receive enable signal 70 and clock signal 66 as inputs, and delay circuit 94 would receive clock signal 66 as an input and provide clock signal 72 as an output. Similarly, for atomic charge pump 56 NAND gate 92 would receive enable signal 70 and clock signal 76 as inputs, and delay circuit 94 would receive dock signal 76 as an input and provide clock signal 78 as an output.

Figure 10:
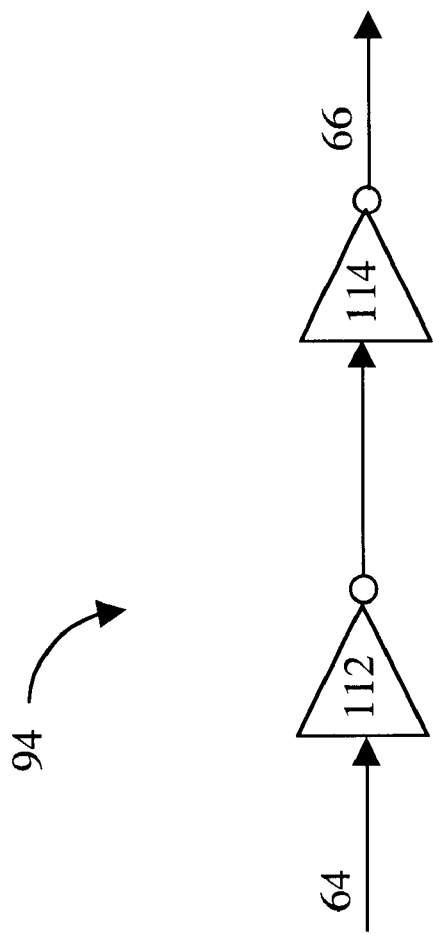
FIG. 10 illustrates in logic diagram form a delay circuit designed in accordance with one embodiment of the present invention.

FIG. 10 illustrates in logic diagram form one embodiment of delay circuit 94 of FIG. 9, which is in accordance with the present invention. In this particular embodiment, delay circuit 94 includes an inverter 112 and an inverter 114. Inverter 112 receives clock signal 64 as an input and the output of inverter 112 is coupled to the input of inverter 114. The output of inverter 114 provides clock signal 66 as an output.

Note that the delay circuit for atomic charge pump 54 may be formed in a similar manner. In this case inverter 112 would receive clock signal 66 as an input and the output of inverter 114 would provide dock signal 72 as an output. Similarly, for atomic charge pump 56 inverter 112 would receive clock signal 76 as an input and the output of inverter 114 would provide clock signal 78 as an output.

Figure 11:
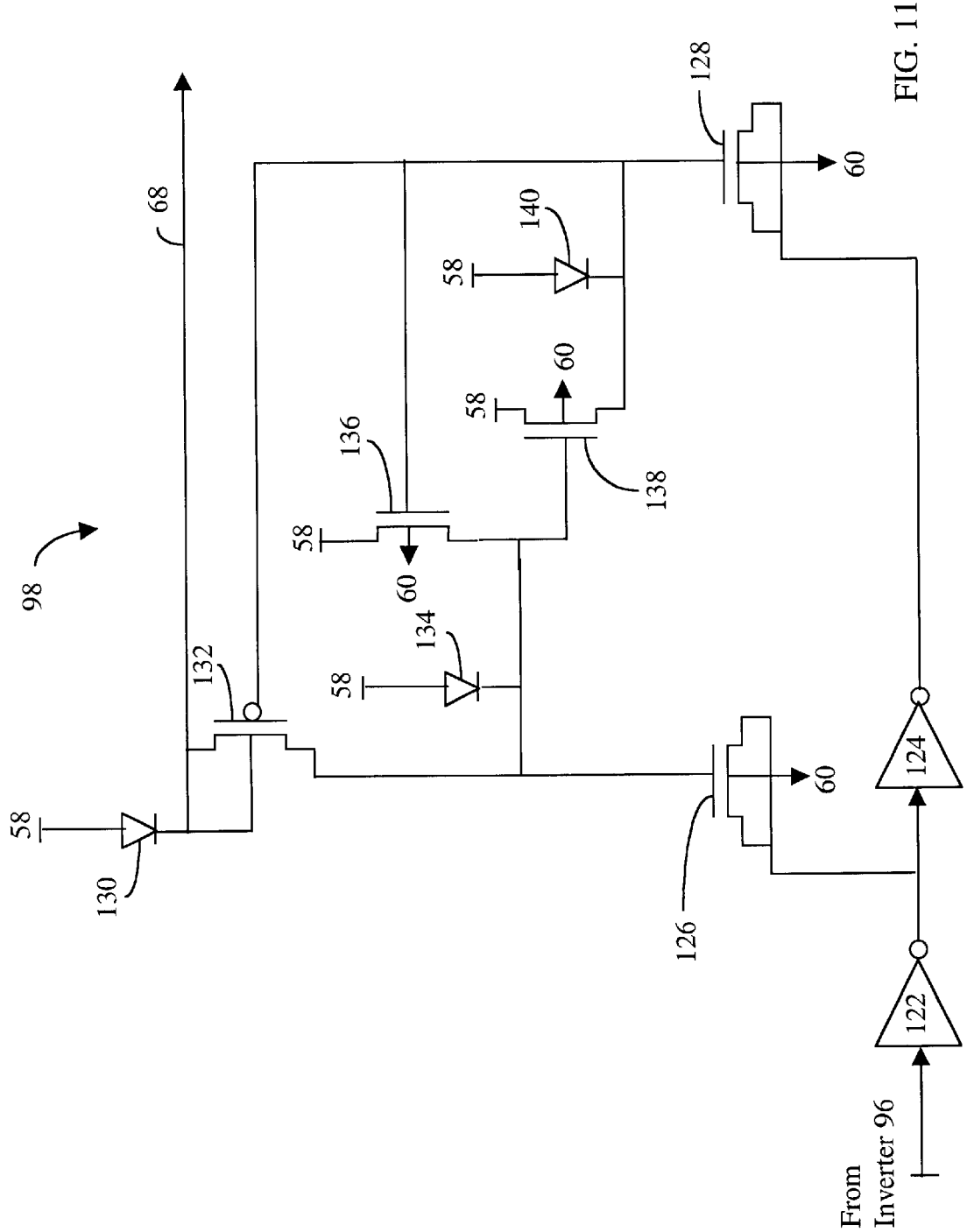
FIG. 11 illustrates in circuit diagram form charge pump circuitry designed in accordance with one embodiment of the present invention.

FIG. 11 illustrates in circuit diagram form one embodiment of pump circuitry 98 of FIG. 9, which is in accordance with the present invention. In this particular embodiment pump circuitry 98 is a single stage pump and it includes an inverter 122, an inverter 124, an NMOS transistor 126, an NMOS transistor 128, a diode 130, a PMOS transistor 132, a diode 134, an NMOS transistor 136, an NMOS transistor 138, and a diode 140.

The input of inverter 122 is coupled to the output of inverter 96 of FIG. 9. The output of inverter 122 is coupled to the input of inverter 124 and to the source region and the drain region of NMOS transistor 126. Reference voltage signal 68 is coupled to the output of diode 130, and the substrate region and the drain region of PMOS transistor 132. The source region of PMOS transistor 132 is coupled to the gate electrode of NMOS transistor 126, the output of diode 134, the gate electrode of NMOS transistor 138, and the source region of NMOS transistor 136. The source region of NMOS transistor 138 is coupled to the output of diode 140, the gate electrode of NMOS transistor 128, the gate electrode of NMOS transistor 136, and the gate electrode of PMOS transistor 132. The source region and the drain region of NMOS transistor 128 are coupled to the output of inverter 124. The substrate regions of NMOS transistor 126, NMOS transistor 128, NMOS transistor 138, and NMOS transistor 136 are all coupled to the second power supply potential 60. The input of diode 130, the input of diode 134, the input of diode 140, the drain region of NMOS transistor 136, and the drain region of NMOS transistor 138 are all coupled to the first power supply potential 58.

Figure 12:
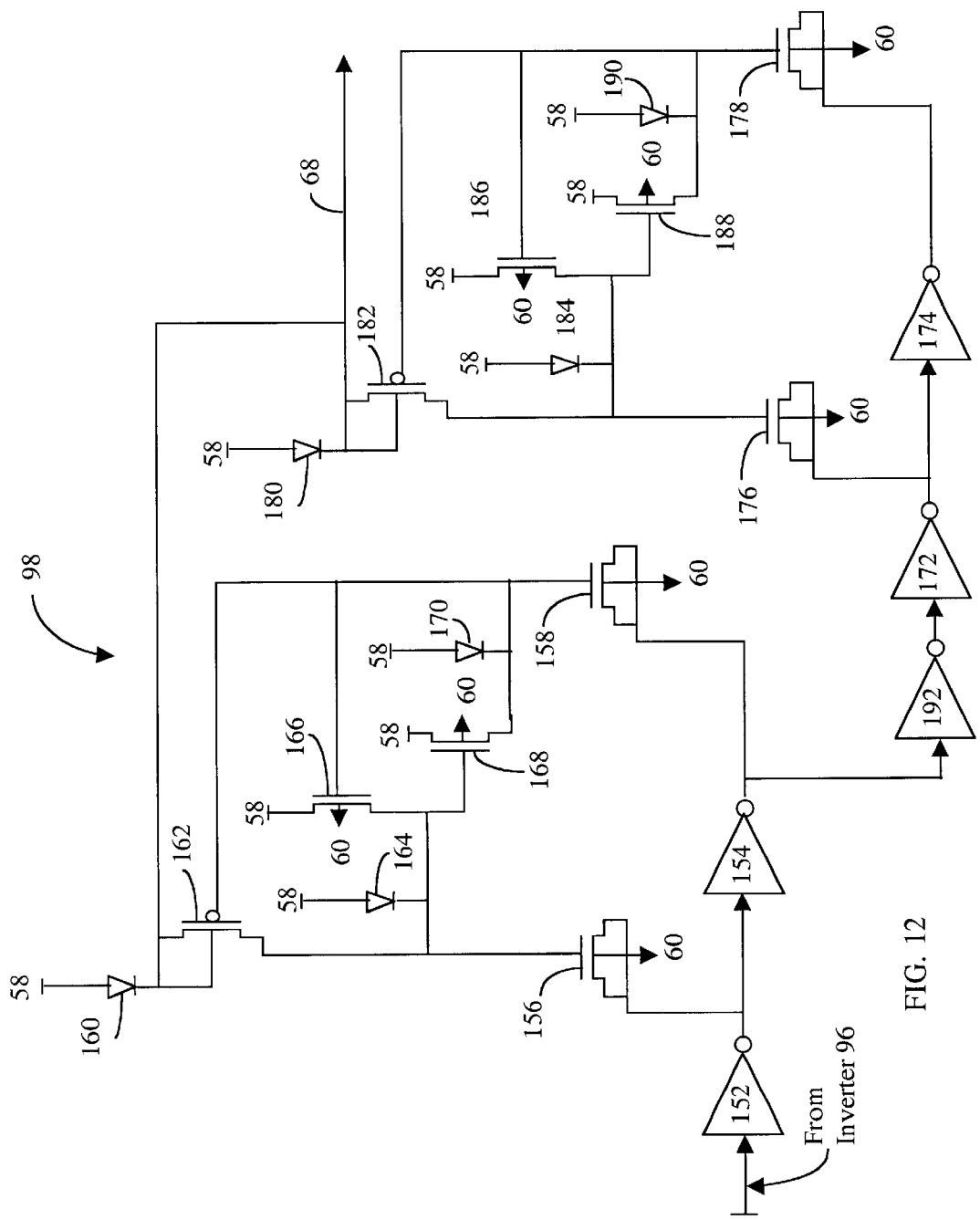
FIG. 12 illustrates in circuit diagram form charge pump circuitry designed in accordance with an alternative embodiment of the present invention.

FIG. 12 illustrates in circuit diagram form an alternative embodiment of pump circuitry 98 of FIG. 9, which is in accordance with the present invention. In this particular embodiment pump circuitry 98 is a two stage pump and it includes an inverter 152, an inverter 154, an NMOS transistor 156, an NMOS transistor 158 a diode 160, a PMOS transistor 162, a diode 164, an NMOS transistor 166, an NMOS transistor 168, a diode 170, an inverter 172, an inverter 174, an NMOS transistor 176, an NMOS transistor 178, a diode 180, a PMOS transistor 182, a diode 184, an NMOS transistor 186, an NMOS transistor 188, a diode 190, and an inverter 192.

In the first stage, the input of inverter 152 is coupled to the output of inverter 96 of FIG. 9. The output of inverter 152 is coupled to the input of inverter 154 and to the source region and the drain region of NMOS transistor 156. Reference voltage signal 68 is coupled to the output of diode 160, and the substrate region and the drain region of PMOS transistor 162. The source region of PMOS transistor 162 is coupled to the gate electrode of NMOS transistor 156, the output of diode 164, the gate electrode of NMOS transistor 168, and the source region of NMOS transistor 166. The source region of NMOS transistor 168 is coupled to the output of diode 170, the gate electrode of NMOS transistor 158, the gate electrode of NMOS transistor 166, and the gate electrode of PMOS transistor 162. The source region and the drain region of NMOS transistor 158 are coupled to the output of inverter 154. The substrate regions of NMOS transistor 156, NMOS transistor 158, NMOS transistor 168, and NMOS transistor 166 are all coupled to the second power supply potential 60. The input of diode 160, the input of diode 164, the input of diode 170, the drain region of NMOS transistor 166, and the drain region of NMOS transistor 168 are all coupled to the first power supply potential 58. The gate of transistor 168 is coupled to the output of diode 164, the source of transistor 166, the gate of transistor 156, and the source of transistor 162.

In the second stage, the input of inverter 192 is coupled to the output of inverter 154. The output of inverter 192 is coupled to the input of inverter 172. The output of inverter 172 is coupled to the input of inverter 174 and to the source region and the drain region of NMOS transistor 176. Reference voltage signal 68 is coupled to the output of diode 180, and the substrate region and the drain region of PMOS transistor 182. The source region of PMOS transistor 182 is coupled to the gate electrode of NMOS transistor 176, the output of diode 184, the gate electrode of NMOS transistor 188, and the source region of NMOS transistor 186. The source region of NMOS transistor 188 is coupled to the output of diode 190, the gate electrode of NMOS transistor 178, the gate electrode of NMOS transistor 186, and the gate electrode of PMOS transistor 182. The source region and the drain region of NMOS transistor 178 are coupled to the output of inverter 174. The substrate regions of NMOS transistor 176, NMOS transistor 178, NMOS transistor 188, and NMOS transistor 186 are all coupled to the second power supply potential 60. The input of diode 180, the input of diode 184, the input of diode 190, the drain region of NMOS transistor 186, and the drain region of NMOS transistor 188 are all coupled to the first power supply potential 58.

Figure 13:
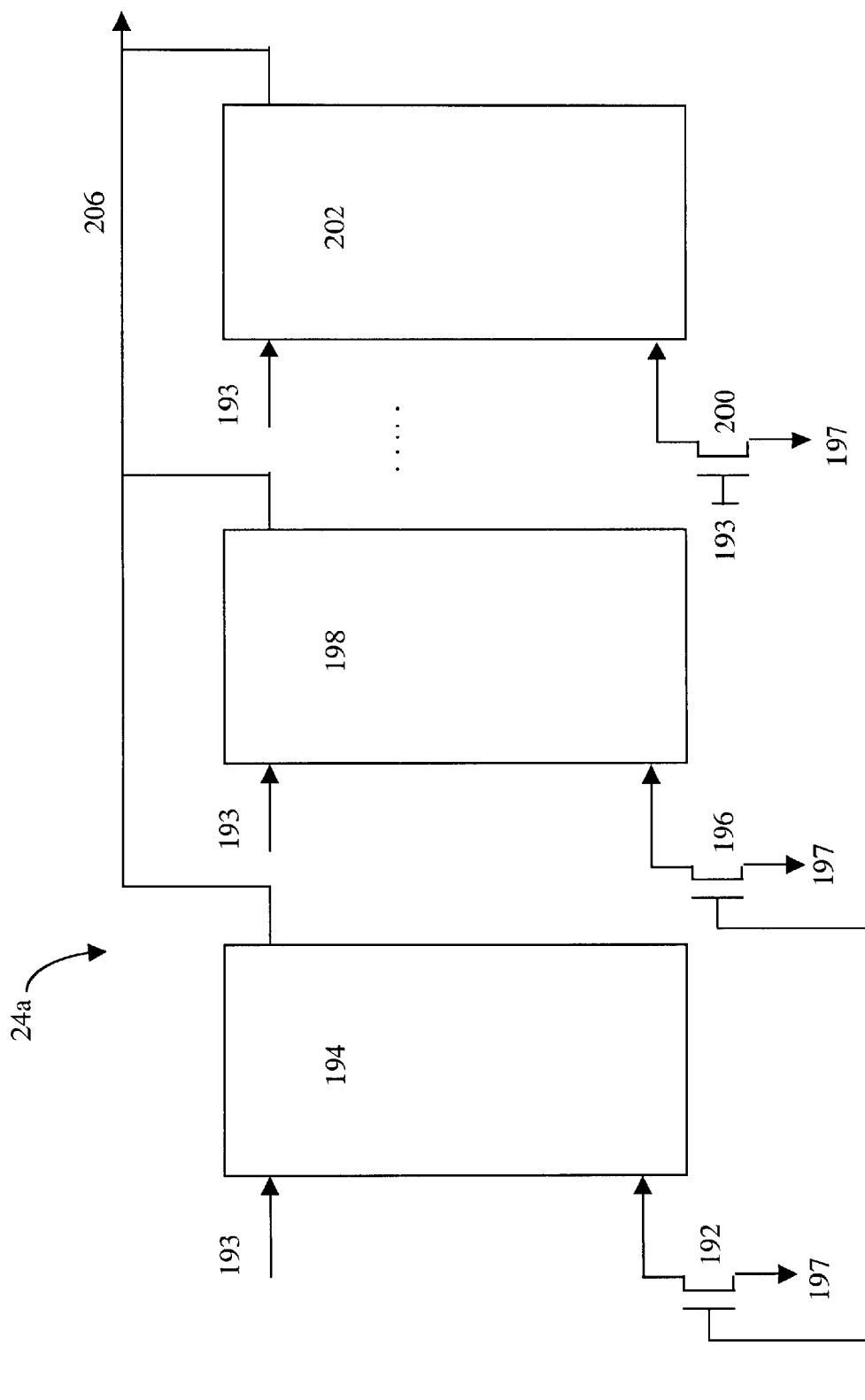
FIG. 13 illustrates in partial circuit diagram form and partial block diagram form a charge source designed in accordance with an alternative embodiment of the present invention.

FIG. 13 illustrates in partial circuit diagram form and partial block diagram form an alternative embodiment of charge source 24a of FIG. 4, which is in accordance with the present invention. In this particular embodiment, charge source 24a includes NMOS transistor 192, atomic voltage regulator 194, NMOS transistor 196, atomic voltage regulator 198, NMOS transistor 200, and atomic voltage regulator 202. In this embodiment N, where N is equal to or greater than one, atomic voltage regulators are ganged or connected together in series to form a distributed voltage regulator. It should be appreciated that the actual number of atomic voltage regulators within charge source 24a will depend upon the load which is to be driven by charge source 24a. In FIG. 13, atomic voltage regulator 194 is the first stage of the distributed voltage regulator, atomic voltage regulator 198 is the second stage of the distributed voltage regulator, and atomic voltage regulator 202 is the Nth stage or Nth atomic voltage regulator in the distributed voltage regulator.

As shown in FIG. 13, enable signal 204 is coupled to the gate electrode of NMOS transistor 192 and the gate electrode of NMOS transistor 196. A first power supply potential 193, similar to potential 58 of the embodiment illustrated in FIG. 5b, is coupled to a first input of atomic voltage regulator 194, a first input of atomic voltage regulator 198, a first input of atomic voltage regulator 202, and the gate electrode of NMOS transistor 200. The drain region of NMOS transistor 192 is coupled to a second input of atomic voltage regulator 194. The drain region of NMOS transistor 196 is coupled to a second input of atomic voltage regulator 198. The drain region of NMOS transistor 200 is coupled to a second input of atomic voltage regulator 202. Reference signal 206, similar to signal 68 of the embodiment illustrated in FIG. 5b, is coupled to the output of atomic voltage regulator 194, the output of atomic voltage regulator 196, and the output of atomic voltage regulator 202. A second power supply potential 197, similar to potential 60 of the embodiment illustrated in FIG. 5b, is coupled to the source region of NMOS transistor 192, the source region of NMOS transistor 196, and the source region of NMOS transistor 200.

It should also be appreciated that charge source 24a allows power consumption within memory tile 22 to be reduced because portions of charge source 24a can be independently powered down. For example, in FIG. 13 atomic voltage regulator 194 and atomic voltage regulator 198 may be powered down via enable signal 204, while atomic voltage regulator 202 remains enabled via the first power supply potential 193. Thus, with our invention the number of atomic voltage regulators operating simultaneously is selectable because a subset of the N atomic voltage regulators within charge source 24a can be powered down.

Figure 14:
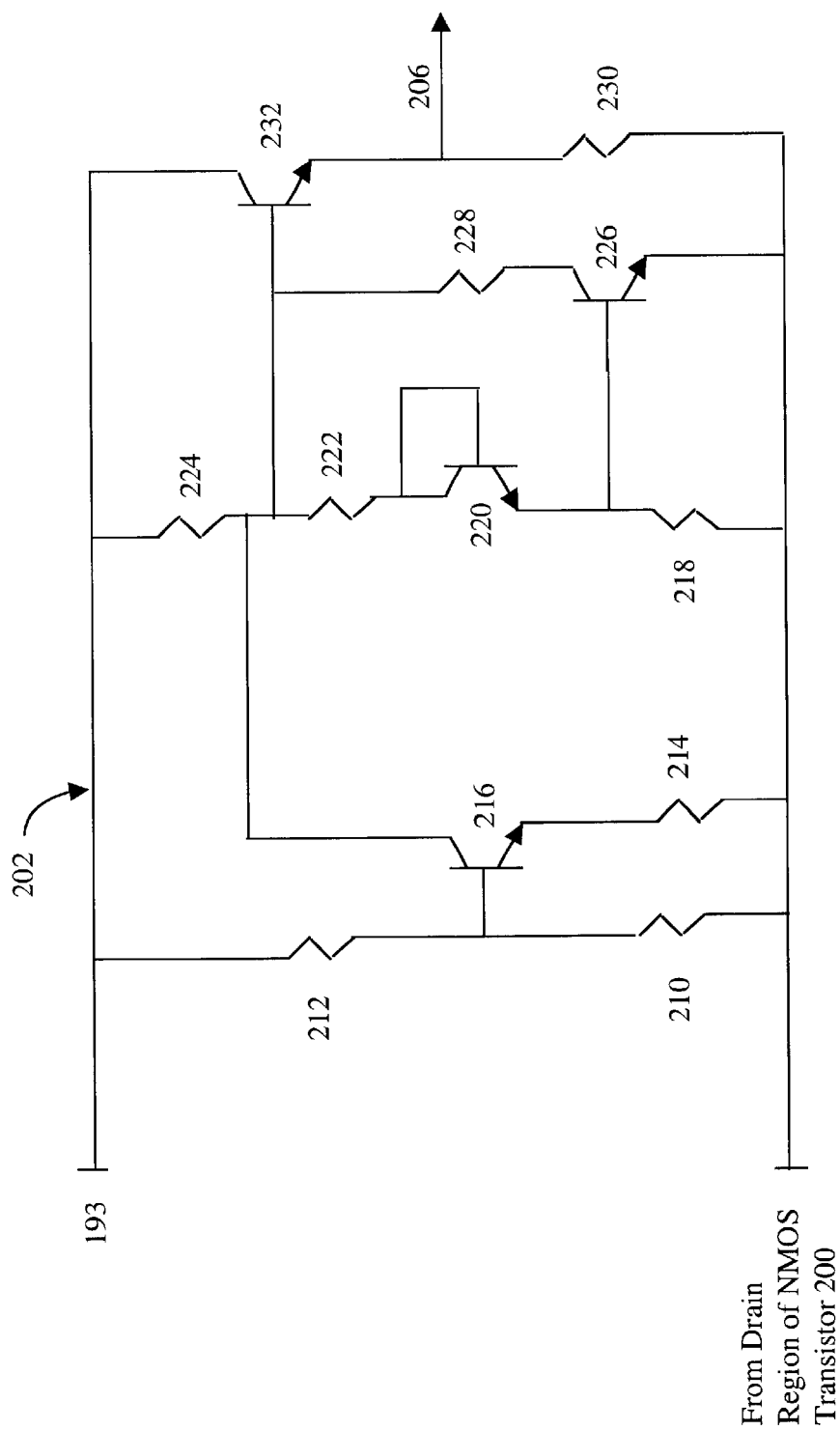
FIG. 14 illustrates in circuit diagram form an atomic voltage regulator designed in accordance with one embodiment of the present invention.

Shown in FIG. 14, is a circuit schematic for atomic voltage regulator 202 of FIG. 13, which is in accordance with one embodiment of the present invention. In this particular embodiment, atomic voltage regulator 202 includes a resistor 210, a resistor 212, a resistor 214, a NPN bipolar transistor 216, a resistor 218, a NPN bipolar transistor 220, a resistor 222, a resistor 224, a NPN bipolar transistor 226, a resistor 228, a resistor 230, and a NPN bipolar transistor 232.

The drain region of NMOS transistor 200 of FIG. 13 is coupled to a first terminal of resistor 210, a first terminal of resistor 214, a first terminal of resistor 218, a first terminal of resistor 230, and the emitter region of NPN bipolar transistor 226. The second terminal of resistor 210 is coupled to a first terminal of resistor 212 and to the base region of NPN bipolar transistor 216. The second terminal of resistor 212, a first terminal of resistor 224, and the collector region of NPN bipolar transistor 232 is coupled to the first power supply potential 193. The second terminal of resistor 214 is coupled to the emitter region of NPN bipolar transistor 216. The collector region of NPN bipolar transistor 216 is coupled to the second terminal of resistor 224, the base region of NPN bipolar transistor 232, a first terminal of resistor 222, and a first terminal of resistor 228. The second terminal of resistor 222 is coupled to the base and collector region of NPN bipolar transistor 220. The emitter region of NPN bipolar transistor 220 is coupled to the second terminal of resistor 218 and the base region of NPN bipolar transistor 226. The collector region of NPN bipolar transistor 226 is coupled to the second terminal of resistor 228. The emitter region of NPN bipolar transistor 232 and the second terminal of resistor 230 are coupled to reference signal 206. Note, the operation of the circuit illustrated in FIG. 14 is described in U.S. Pat. No. 4,570,114, and the subject matter of U.S. Pat. No. 4,570,114 is expressly incorporated herein by reference.

Note, that atomic voltage regulator 194 may be formed in a similar manner. In this case the drain region of NMOS transistor 192, of FIG. 13, would be connected the first terminal of resistor 210, the first terminal of resistor 214, the first terminal of resistor 218, the first terminal of resistor 230, and the emitter region of NPN bipolar transistor 226. Similarly, for atomic voltage regulator 198 the drain region of NMOS transistor 196, of FIG. 13, would be coupled to the first terminal of resistor 210, the first terminal of resistor 214, the first terminal of resistor 218, the first terminal of resistor 230, and the emitter region of NPN bipolar transistor 226.

Figure 15C:
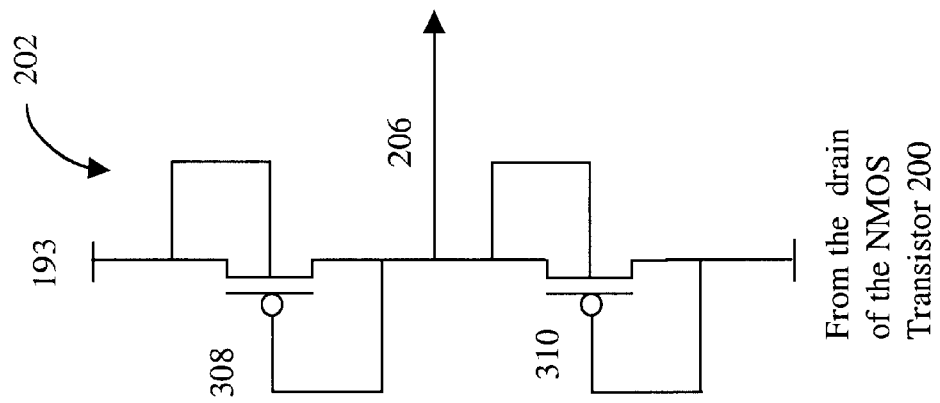
FIG. 15c illustrates in circuit diagram form an atomic voltage regulator designed in accordance with an alternative embodiment of the present invention.
Figure 15B:
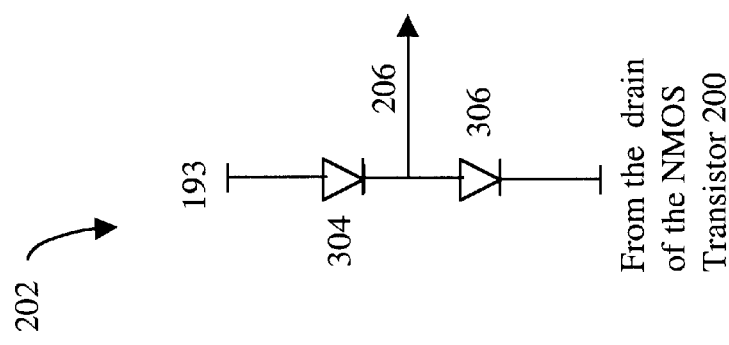
FIG. 15b illustrates in circuit diagram form an atomic voltage regulator designed in accordance with an alternative embodiment of the present invention.
Figure 15A:
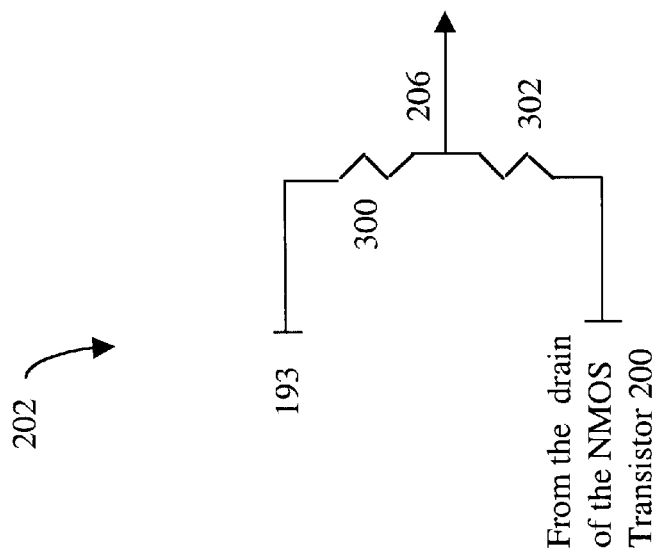
FIG. 15a illustrates in circuit diagram form an atomic voltage regulator designed in accordance with an alternative embodiment of the present invention.

FIG. 15a illustrates in circuit diagram form an alternative embodiment of atomic voltage regulator 202 of FIG. 13, which is in accordance with the present invention. In this particular embodiment atomic voltage regulator 202 includes resistor 300 and resistor 302.

A first terminal of resistor 300 is coupled to first power supply potential 193. Reference signal 206 is coupled to the second terminal of resistor 300 and a first terminal of resistor 302. The second terminal of resistor 302 is coupled to the drain of NMOS transistor 200. Note, that atomic voltage regulator 194 may be formed in a similar manner. In this case the drain region of NMOS transistor 192 would be connected to the second terminal of resistor 302. Similarly, for atomic voltage regulator 198 the drain region of NMOS transistor 196 would be connected to the second terminal of resistor 302.

FIG. 15b illustrates in circuit diagram form an alternative embodiment of atomic voltage regulator 202 of FIG. 13, which is in accordance with the present invention. In this particular embodiment atomic voltage regulator 202 includes diode 304 and diode 306.

The input of diode 304 is coupled to the first power supply potential 193. Reference signal 206 is coupled to the output of diode 304 and the input of diode 306. The out put of diode 306 is coupled to the drain of NMOS transistor 200. Note, that atomic voltage regulator 194 and atomic voltage regulator 198 may be configured in a similar manner. Note, that atomic voltage regulator 194 may be formed in a similar manner. In this case the drain region of NMOS transistor 192 would be connected to the output of diode 306. Similarly, for atomic voltage regulator 198 the drain region of NMOS transistor 196 would be connected to the output of diode 306.

FIG. 15c illustrates in circuit diagram form an alternative embodiment of atomic voltage regulator 202 of FIG. 13, which is in accordance with the present invention. In this particular embodiment atomic voltage regulator 202 includes PMOS transistor 308 and PMOS transistor 310.

Thee substrate region and the drain region of PMOS transistor 308 are coupled to the first power supply potential 193. Reference signal 206 is coupled to the gate electrode and source region of PMOS transistor 308, and to the substrate region and drain region of PMOS transistor 310. The drain region of NMOS transistor 200 is coupled to the gate electrode and source region of PMOS transistor 310. Note, that atomic voltage regulator 194 may be formed in a similar manner. In this case the drain region of NMOS transistor 192 would be connected to the substrate region and drain region of PMOS transistor 310. Similarly, for atomic voltage regulator 198 the drain region of NMOS transistor 196 would be connected to the substrate region and drain region of PMOS transistor 310.

Figure 16:
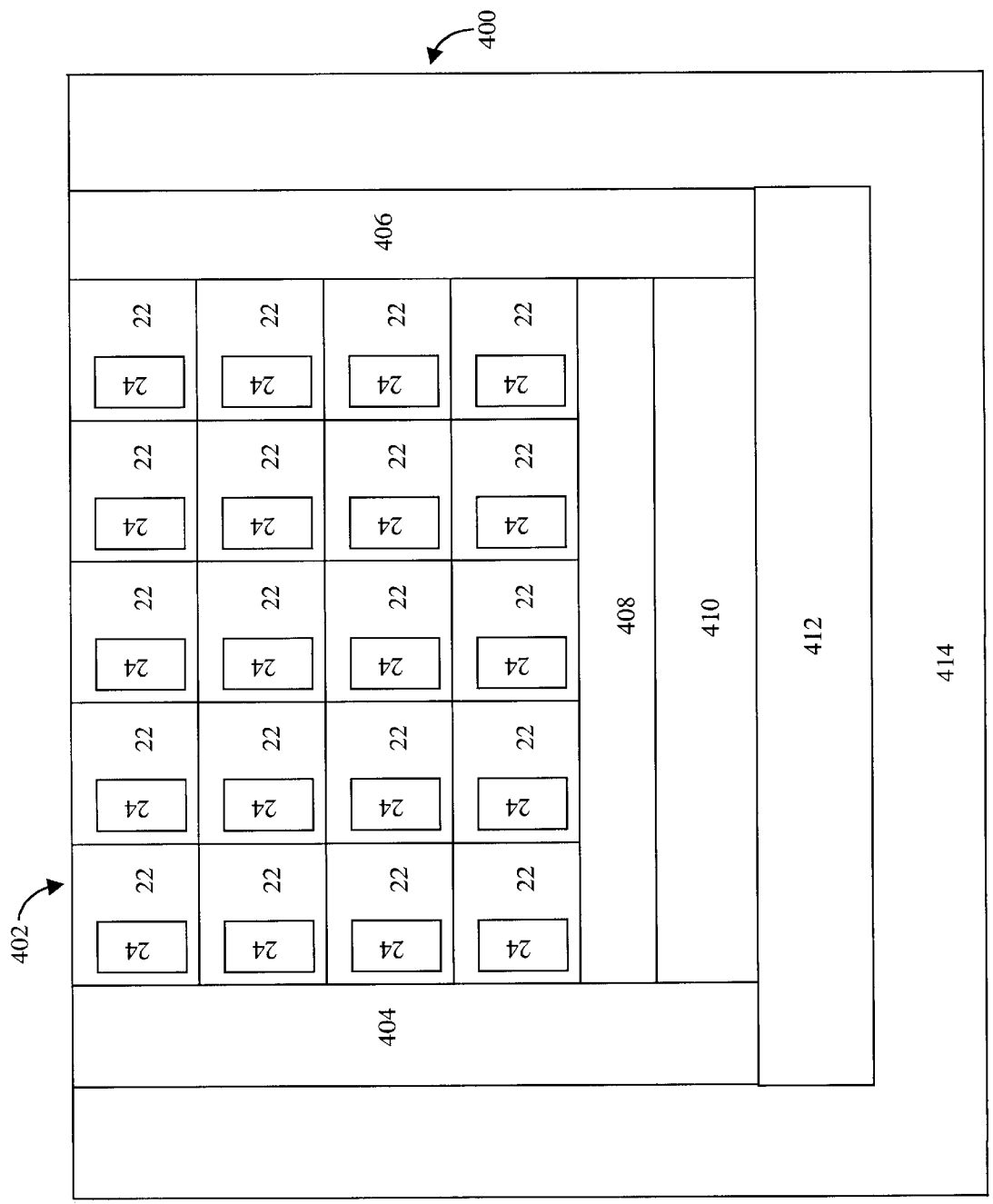

FIG. 16 illustrates in block diagram form an integrated circuit device 400 that is in accordance with an alternative embodiment of the present invention. In this particular embodiment integrated circuit device 400 includes a tiled memory array 402, fuse circuitry 404, error detection and correction circuitry 406, test circuitry 408, memory interface circuitry 410, logic circuitry 412, and input/output circuitry 414.

Fuse circuitry 404 is coupled to tiled memory array 402 and is used to repair defects within tiled memory array 402. Error detection and correction circuitry 406 is coupled to tiled memory array 402 and detects and corrects errors within tiled memory array 402. Note, error detection and correction circuitry 406 may be used to correct soft or hard errors. Test circuitry 408 is coupled to tiled memory array 402 and is used to test tiled memory array 402. In one embodiment, test circuitry 408 is built in self test (BIST) circuitry. In an alternative embodiment, test circuitry is built in self repair (BISR) circuitry. In another embodiment, test circuitry 408 includes both BIST circuitry and BISR circuitry. Memory interface circuitry 410 is coupled to tiled memory array 402 and contains circuitry which allows tiled memory array 402 to interface with logic circuitry 412. More specifically, memory interface circuitry 410 contains circuitry which allows tiled memory array 402 to interface with different logic architectures. For example, if logic circuitry 412 includes an ARM microprocessor, then memory interface circuitry 410 includes circuitry which allows tiled memory array 402 to interface with the ARM microprocessor. In one embodiment, memory interface circuitry 410 includes a DRAM controller. In alternative an embodiment, memory interface 410 includes refresh control circuitry which allows tiled memory array 402 to interface with logic circuitry. In another embodiment, memory interface circuitry 410 includes circuitry which controls the power consumption of memory array 402, and thus allows tiled memory array 402 to interface with logic circuitry 412. Note, tiled memory array 402 includes a plurality of memory tiles 22, and each of the memory tiles 22 contains its own charge source circuitry 24, as previously discussed above. It should be appreciated that in this particular embodiment memory tiles 22 have been used to form tiled memory array 402 that is embedded within integrated circuit 400.

Figure 17:
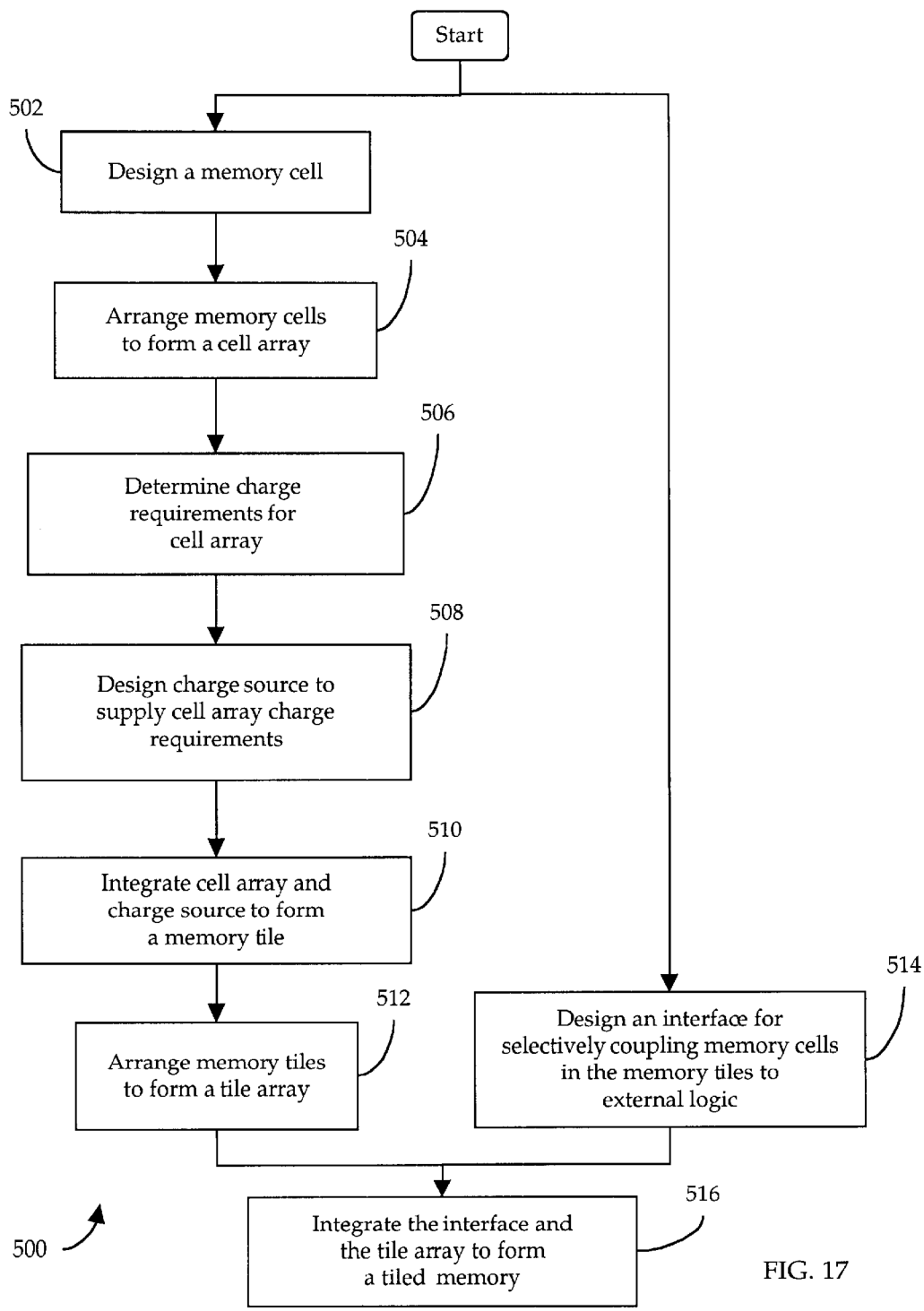
FIG. 17 illustrates in flow diagram form a process for designing a tiled memory in accordance with one embodiment of the present invention.

It should be appreciated that tiled memory devices and integrated circuit devices having an embedded tiled memory can be advantageously fabricated with the present invention because once a memory tile has been designed it can be used to form a multitude of memory array instantiations. The process flow 500 for designing a tiled memory in accordance with the present invention is shown in FIG. 17. In step 502 the memory cells are designed. A plurality of the memory cells are then arranged to form a cell array in step 504. In step 506, the charge requirements for the cell array are then determined. A charge source to supply the charge requirements of the cell array is then designed in step 508. The charge source and the cell array are then integrated together to form a memory tile in step 510. In step 512, a plurality of memory tiles are then arranged to form a tile array. An interface for selectively coupling memory cells within the tile array to external logic is then designed in step 514. Step 514 is illustrated as a separate path in the flow diagram of FIG. 17, as step 514 may be performed in parallel with the other path for steps 502 to 512. In step 516, the interface is integrated with the tile array to form a tiled memory. Note, the tiled memory can then be used as a stand alone memory device or as a tiled memory which is embedded within an integrated circuit.

Thus it is apparent that there has been provided, in accordance with the present invention, an integrated circuit having a tiled memory array, wherein the tiled memory array includes a plurality of a memory tiles, and each of the memory tiles has its own charge source circuitry. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What we claim is:

1. In an integrated circuit which requires n units of charge per unit of time, a charge source comprising at least n atomic charge pumps, wherein each atomic charge pump provides one unit of charge per unit of time.

2. The charge source of claim 1 wherein at least a portion of the at least n atomic charge pumps operate sequentially.

3. The charge source of claim 2 wherein the portion of the at least n atomic charge pumps operating sequentially is selectable.

4. The charge source of claim 3 further comprising a voltage level detector coupled to the charge source, the voltage level detector detecting incorrect operation of said charge source.

5. The charge source of claim 4 wherein the voltage level detector, in response to detecting incorrect operation of said charge source, provides an output signal.

6. The charge source of claim 5 wherein the voltage level detector, in response to detecting incorrect operation of said charge source, disables said charge source.

7. In an integrated circuit which requires n units of charge per unit of time, a charge source comprising at least n atomic voltage regulators, wherein each atomic voltage regulator provides one unit of charge per unit of time.

8. The charge source of claim 7 wherein at least a portion of the at least n atomic voltage regulators operate simultaneously.

9. The charge source of claim 8 wherein the portion of the at least n atomic voltage regulators operating simultaneously is selectable.

10. The charge source of claim 9 wherein said charge source further comprises a voltage level detector coupled to the charge source, the voltage level detector detecting incorrect operation of said charge source.

11. The charge source of claim 10 wherein the voltage level detector, in response to detecting incorrect operation of said charge source, provides an output signal.

12. The charge source of claim 11 wherein the voltage level detector, in response to detecting incorrect operation of said charge source, disables said charge source.

13. A method for designing a charge source for use in a predetermined portion of an integrated circuit, comprising the steps of:

designing an atomic charge source which provides a predetermined unit of charge per predetermined unit of time;

determining the maximum unit charge requirements, n, of said predetermined portion of said integrated circuit per unit of time; and integrating at least n of said atomic charge sources into said predetermined portion of said integrated circuit.

14. The method of claim 13 wherein said atomic charge source is an atomic charge pump.

15. The method of claim 14 wherein at least a portion of the at least n atomic charge pumps are designed to operate sequentially.

16. The method of claim 15 wherein the portion of the at least n atomic charge pumps operating sequentially is designed to be selectable.

17. The method of claim 13 further comprising the step of designing a voltage level detector coupled to the charge source, the voltage level detector being designed to detect incorrect operation of said charge source.

18. The method of claim 17 wherein the voltage level detector is designed to provide an output signal in response to detecting incorrect operation of said charge source.

19. The method of claim 18 wherein the voltage level detector is designed to disable said charge source in response to detecting incorrect operation of said charge source.

20. The method of claim 13 wherein said atomic charge source is an atomic voltage regulator.

21. The method of claim 20 wherein at least a portion of the at least n atomic voltage regulators are designed to operate simultaneously.

22. The method of claim 21 wherein the portion of the at least n atomic voltage regulators operating simultaneously is designed to be selectable.

* * * * *